United States Patent
Cho et al.

(10) Patent No.: US 10,334,193 B2
(45) Date of Patent: Jun. 25, 2019

(54) READ-OUT CIRCUITS OF IMAGE SENSORS AND IMAGE SENSORS INCLUDING THE SAME

(71) Applicant: SAMSUNG ELECTRONICS CO., LTD., Suwon-si, Gyeonggi-Do (KR)

(72) Inventors: Kyu-Ik Cho, Hwaseong-si (KR); Ji-Yong Kim, Gimpo-si (KR); Jae-Jung Park, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 319 days.

(21) Appl. No.: 15/415,273

(22) Filed: Jan. 25, 2017

(65) Prior Publication Data

US 2017/0237914 A1 Aug. 17, 2017

(30) Foreign Application Priority Data

Feb. 11, 2016 (KR) ........................ 10-2016-0015505
Jan. 11, 2017 (KR) ........................ 10-2017-0004055

(51) Int. Cl.

| H04N 5/369 | (2011.01) |
|---|---|
| H04N 5/357 | (2011.01) |
| H04N 5/378 | (2011.01) |
| H03K 4/50 | (2006.01) |
| H04N 5/3745 | (2011.01) |

(52) U.S. Cl.
CPC ............ H04N 5/3575 (2013.01); H03K 4/50 (2013.01); H04N 5/357 (2013.01); H04N 5/3698 (2013.01); H04N 5/378 (2013.01); H04N 5/3745 (2013.01)

(58) Field of Classification Search
CPC .... H04N 5/3575; H04N 5/3745; H04N 5/357; H04N 5/378; H04N 5/3698; H03K 4/50
See application file for complete search history.

(56) References Cited

U.S. PATENT DOCUMENTS

| 5,052,808 A | * 10/1991 | Hilby .................. G01C 19/726 356/464 |
|---|---|---|
| 5,508,635 A | 4/1996 | Kwon |
| 6,191,647 B1 | 2/2001 | Tanaka et al. |
| 7,116,138 B2 | 10/2006 | Lim |

(Continued)

FOREIGN PATENT DOCUMENTS

JP 2014-174692 A 9/2014

*Primary Examiner* — Hung H Lam
(74) *Attorney, Agent, or Firm* — Volentine, Whitt & Francos, PLLC

(57) ABSTRACT

A read-out circuit of an image sensor includes a ramp signal generator, a bias voltage generator and a conversion circuit. The ramp signal generates a ramp signal that linearly varies at a constant slope. The bias voltage generator generates a bias voltage based on a power supply voltage having a first noise component. The conversion circuit generates a reference voltage based on the bias voltage and the ramp signal, and performs an analog-to-digital conversion on an analog signal from a pixel to generate a digital signal corresponding to the analog signal. The analog signal has second noise component. The bias voltage generator adjusts an alternating current component included in the bias voltage such that a magnitude of a third noise component added to the reference voltage is substantially the same as a magnitude of the second noise component.

20 Claims, 19 Drawing Sheets

(56) References Cited

U.S. PATENT DOCUMENTS

| | | |
|---|---|---|
| 8,072,512 B2 | 12/2011 | Lee et al. |
| 8,174,422 B2 | 5/2012 | Okamoto et al. |
| 8,420,994 B2 | 4/2013 | Sano et al. |
| 8,482,448 B2 | 7/2013 | Burm et al. |
| 8,576,317 B2 * | 11/2013 | Sakakibara ............ H04N 5/355 348/308 |
| 9,148,596 B1 | 9/2015 | Sun et al. |
| 9,160,948 B2 | 10/2015 | Yoo |
| 9,610,948 B2 | 4/2017 | Kumar et al. |
| 10,027,919 B2 * | 7/2018 | Kobuse ................ H04N 5/3655 |
| 10,142,575 B2 * | 11/2018 | Meynants ......... H01L 27/14609 |
| 10,165,214 B2 * | 12/2018 | Sakuragi ................ H04N 5/378 |
| 2006/0164277 A1 * | 7/2006 | Lee ........................... G06J 1/00 341/155 |
| 2015/0263714 A1 | 9/2015 | Yoo |

* cited by examiner

READ-OUT CIRCUITS OF IMAGE SENSORS AND IMAGE SENSORS INCLUDING THE SAME

CROSS-REFERENCE TO RELATED APPLICATION

A claim for priority under 35 U.S.C. § 119 is made to Korean Patent Application No. 10-2016-0015505, filed on Feb. 11, 2016 and to Korean Patent Application No. 10-2017-0004055, filed on Jan. 11, 2017 in the Korean Intellectual Property Office (KIPO), the entire contents of which are hereby incorporated by reference.

BACKGROUND

The present inventive concepts herein relate to image sensors, and more particularly to read-out circuits of image sensors capable of reducing noise and image sensors including the same.

An image sensor is a semiconductor device that converts a photo image, such as light reflected by a subject for example, into an electric signal. Image sensors are widely used in portable electronic devices such as digital cameras, cellular phones, and the like. Image sensors can be generally classified into charged coupled device (CCD) image sensors and complementary metal oxide semiconductor (CMOS) image sensors. Recently, CMOS image sensors have received more attention compared to CCD image sensors due to advantages such as low manufacturing costs, low power consumption, ease of integration with peripheral circuits, and the like. CMOS image sensors may be classified generally into rolling shutter CMOS image sensors and global shutter CMOS image sensors.

SUMMARY

Embodiments of the inventive concept provide a read-out circuit of an image sensor capable of reducing influence of power supply noise.

Embodiments of the inventive concept provide an image sensor including the read-out circuit, capable of enhancing performance.

Embodiments of the inventive concept provide a read-out circuit of an image sensor, the read-out circuit including a ramp signal generator, a bias voltage generator and a conversion circuit. The ramp signal generator is configured to generate a ramp signal that linearly varies with a constant slope. The bias voltage generator is configured to generate a bias voltage based on a power supply voltage, the power supply voltage having a first noise component. The conversion circuit is configured to generate a reference voltage based on the bias voltage and the ramp signal, and configured to perform an analog-to-digital conversion on an analog signal from a pixel to generate a digital signal corresponding to the analog signal. The analog signal has a second noise component. The bias voltage generator is further configured to adjust an alternating current (AC) component included in the bias voltage so that a magnitude of a third noise component in the reference voltage is substantially the same as a magnitude of the second noise component.

Embodiments of the inventive concept provide an image sensor including a pixel array, a ramp signal generator, a bias voltage generator, and a plurality of conversion circuits. The pixel array is connected to a power supply voltage, the pixel array including a plurality of unit pixels configured to sense an incident light and to generate analog signals. The ramp signal generator is configured to generate a ramp signal that changes with a constant slope. The bias voltage generator is configured to generate a bias voltage based on a power supply voltage, the power supply voltage having a first noise component. The plurality of conversion circuits are each configured to generate a reference voltage based on the bias voltage and the ramp signal, and are configured to perform an analog-to-digital conversion on respective different ones of the analog signals to generate digital signals corresponding to the analog signals. The analog signals have a second noise component. The bias voltage generator is configured to adjust an alternating current (AC) component included in the bias voltage so that a magnitude of a third noise component in the reference voltage is substantially the same as a magnitude of the second noise component.

Embodiments of the inventive concept provide an image sensor including a pixel connected to a power supply voltage and configured to generate an analog signal responsive to incident light, the power supply voltage having a first noise component and the analog signal having a second noise component; and a read-out circuit configured to generate a bias voltage based on the power supply voltage, to generate a reference voltage based on the bias voltage and a ramp signal, to convert the analog signal to a digital signal, and to adjust an alternating current (AC) component in the bias voltage so that a magnitude of a third noise component in the reference voltage is substantially the same as a magnitude of the second noise component.

Accordingly, the read-out circuit and the image sensor including the read-out circuit may cancel a noise component by adjusting the noise component of the reference voltage to have substantially the same magnitude as a magnitude of a noise component of the analog signal which is output from a unit pixel.

BRIEF DESCRIPTION OF THE DRAWINGS

Illustrative, non-limiting embodiments of the inventive concept will be more clearly understood from the following detailed description taken in conjunction with the accompanying drawings.

DETAILED DESCRIPTION

Various embodiments of the inventive concept will now be described more fully with reference to the accompanying drawings.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
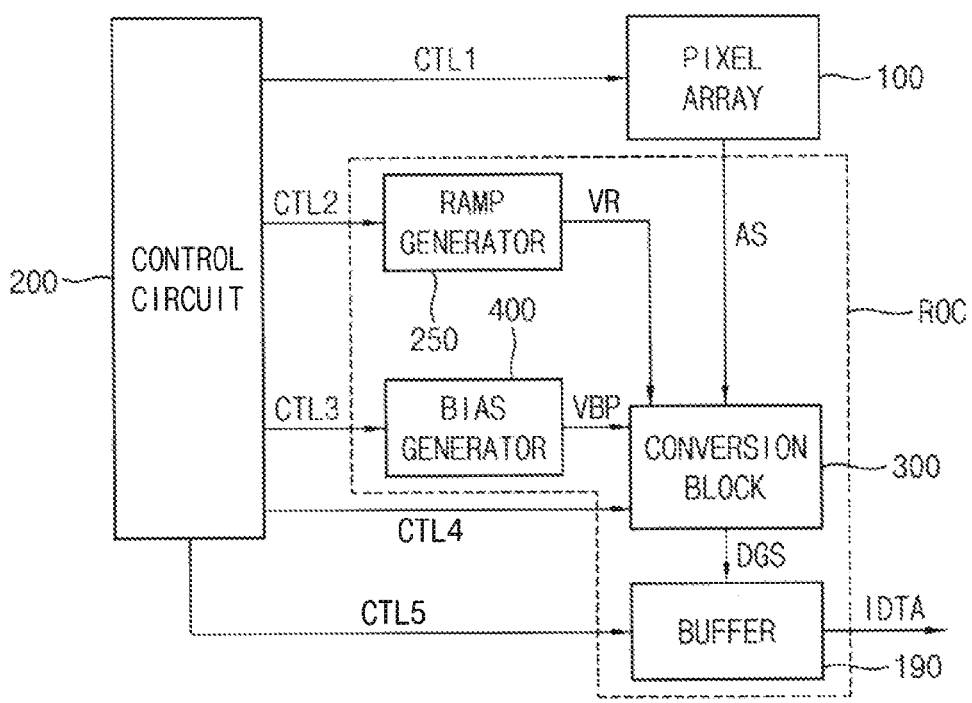
FIG. 1 illustrates a block diagram of an image sensor according to an embodiment of the inventive concept.

FIG. 1 illustrates a block diagram of an image sensor according to an embodiment of the inventive concept.

Referring to FIG. 1, an image sensor 10 includes a pixel array 100, a control circuit 200 and a read-out circuit ROC. The read-out circuit ROC includes a ramp signal generator 250, a bias voltage generator 400, a conversion block 300, and a buffer 190.

The pixel array 100 detects incident light to generate an analog signal AS. The pixel array 100 may include a plurality of unit pixels arranged in the form of a matrix and each unit pixel may detect the incident light to generate the analog signal AS. Each unit pixel may convert incident light to an electric signal and may store the electric signal.

The ramp signal generator 250 generates a ramp signal VR which linearly varies at a constant slope.

The bias voltage generator 400 generates a bias voltage VBP or VBN based on a power supply voltage, and an alternating current (AC) component of the power supply voltage may include a first noise component. Therefore, the bias voltage VBP or VBN may include an AC component, and the bias voltage generator 400 may adjust a magnitude (or, a characteristic) of the AC component of the bias voltage VBP or VBN and provide the bias voltage VBP or VBN to the conversion block 300.

The conversion block 300 generates a reference voltage based on the bias voltage VBP and the ramp signal VR, and performs a single-slope analog-to-digital conversion on the analog signal AS by using the reference voltage to generate a digital signal DGS. In addition, the conversion block 300 performs a single-slope analog-to-digital conversion on the analog signal AS by using the ramp signal VR to generate the digital signal DGS. That is, the conversion block 300 may be an analog-to-digital conversion block or an analog-to-digital conversion circuit. The unit pixels that provide the analog signal AS are also coupled to the power supply voltage to which the bias voltage generator 400 is connected. Therefore, a second noise component due to the first noise component of the power supply voltage may be added to the analog signal AS. The bias voltage generator 400 may adjust the magnitude of the AC component of the bias voltage VBP so that a magnitude of a third noise component added to (or created in) the reference voltage is substantially the same as a magnitude of the second noise component. In addition, the bias voltage generator 400 may adjust the magnitude of the AC component of the bias voltage VBN so that a magnitude of a third noise component provided to the analog signal AS is substantially the same as a magnitude of the second noise component, and a phase of the third noise component is substantially opposite to a phase of the second noise component.

The control circuit 400 may control operation of the pixel array 100 through a first control signal CTL1, may control operation of the ramp signal generator 250 through a second control signal CTL2, may control operation of the bias voltage generator 400 through a third control signal CTL3, may control operation of the conversion block 300 through a fourth control signal CTL4, and may control operation of the buffer 190 through a fifth control signal CTL5.

The buffer 190 temporarily stores the digital signal DGS from the conversion block 300 and may perform sensing and amplification operations on the digital signal DGS to generate corresponding image data IDTA to be output.

Figure 2:
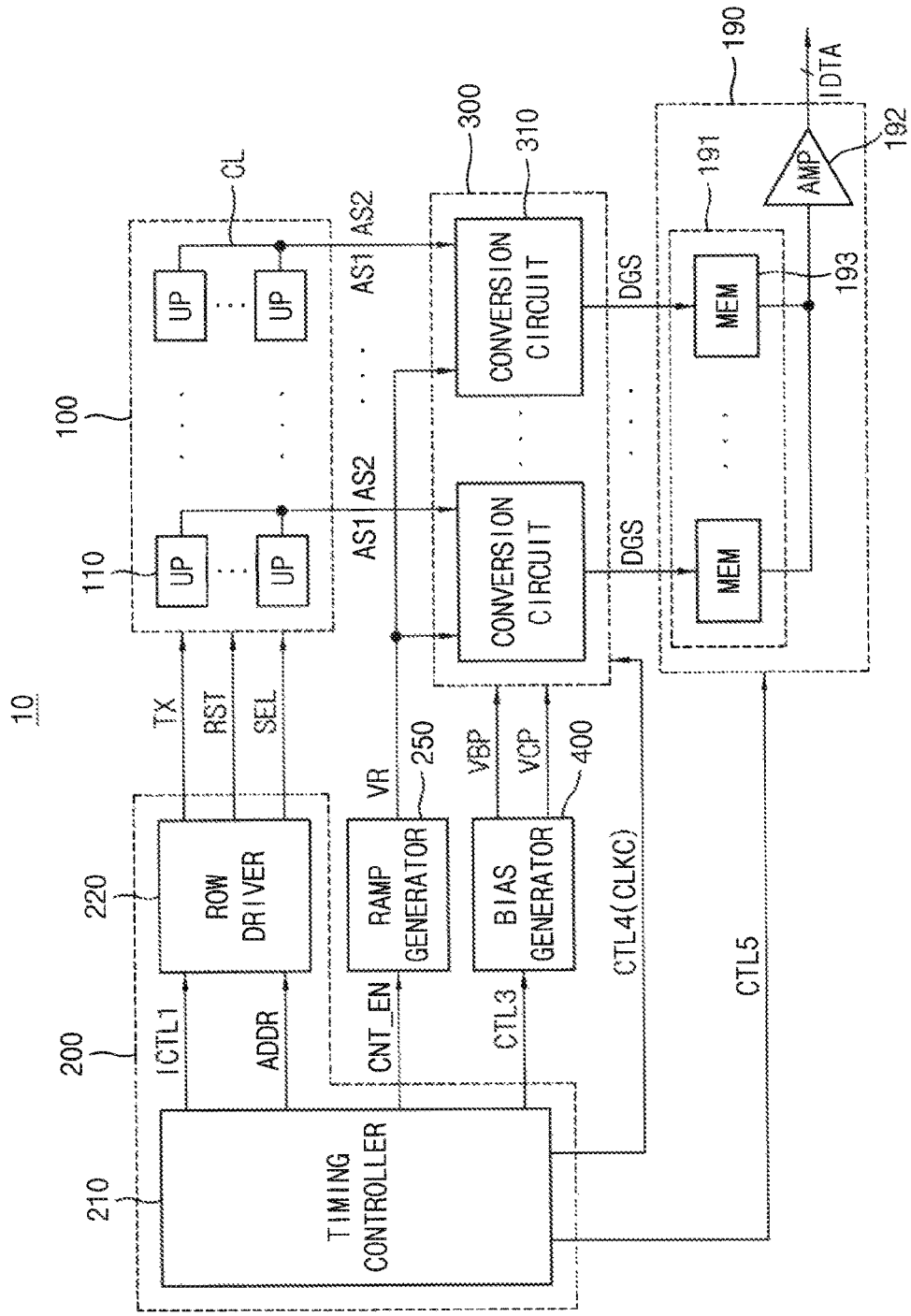
FIG. 2 further illustrates the image sensor of FIG. 1 according to an embodiment of the inventive concept.

FIG. 2 further illustrates the image sensor of FIG. 1 according to an embodiment of the inventive concept.

Referring to FIG. 2, the image sensor 10 includes as in FIG. 1 the pixel array 100, the control circuit 200, the ramp signal generator 250, the bias voltage generator 400, the conversion block 300, and the buffer 190.

The control circuit 200 includes a timing controller 210 and a row driver 220. The pixel array 100 may include a plurality of unit pixels (UP) 110 arranged in a matrix that includes a plurality of rows and a plurality of columns. The conversion block 300 may include a plurality of conversion circuits 310, and each of the conversion circuits 310 are coupled to respective ones of the columns of the unit pixels 110 through a corresponding column line CL. The buffer 190 includes a column memory block 191 and a sense amplifier 192. The column memory block 191 includes a plurality of individual memories 193. The plurality of memories 193 store the digital signals DGS provided from the conversion circuits 310. The sense amplifier 192 senses and amplifies the digital signals DGS stored in the column memory block 191 and then outputs the image data IDTA.

The timing controller 210 may provide the row driver 220 with a first internal control signal ICTL1 and an address signal ADDR, and the row driver 220 may control operation of the unit pixels 110 of the pixel array 100 on a row by row basis based on the first internal control signal ICTL1 and the address signal ADDR. For example, the row driver 220 controls operation of the unit pixels 110 of the pixel array 100 on a row by row basis by applying a (row) selection control signal SEL, a reset control signal RST and a transfer control signal TX to the pixel array 100. The selection control signal SEL, the reset control signal RST and the transfer control signal TX may be collectively characterized as the first control signal CTL1.

Each of the unit pixels 110 of the pixel array 100 may generate a first analog signal AS1 representing a reset component and a second analog signal AS2 representing an image component based on the selection control signal SEL, the reset control signal RX and the transfer control signal TX provided from the row driver 220. Since each of the unit pixels 110 included in the pixel array 100 has their own pixel property or logic property which influences the analog signal AS output therefrom, variation may occur in amplitude of the analog signal AS generated from the unit pixels based on the same incident light. Thus, it is necessary to extract the effective component of the incident light based on the difference between the reset component generated from each unit pixel and the image component according to the incident light.

To this end, each of the unit pixels 110 included in the pixel array 100 sequentially generates the first analog signal AS1 representing the reset component and the second analog signal AS2 representing the image component according to the incident light based on the selection control signal SEL, the reset control signal RST and the transfer control signal TX provided from the row driver 220. The conversion block 300 generates a first digital signal corresponding to the first analog signal AS1 and a second digital signal corresponding to the second analog signal AS2, to output the digital signal DGS based on the difference between the first and second digital signals. Therefore, the digital signal DGS may represent the effective component of the incident light.

Figure 3:
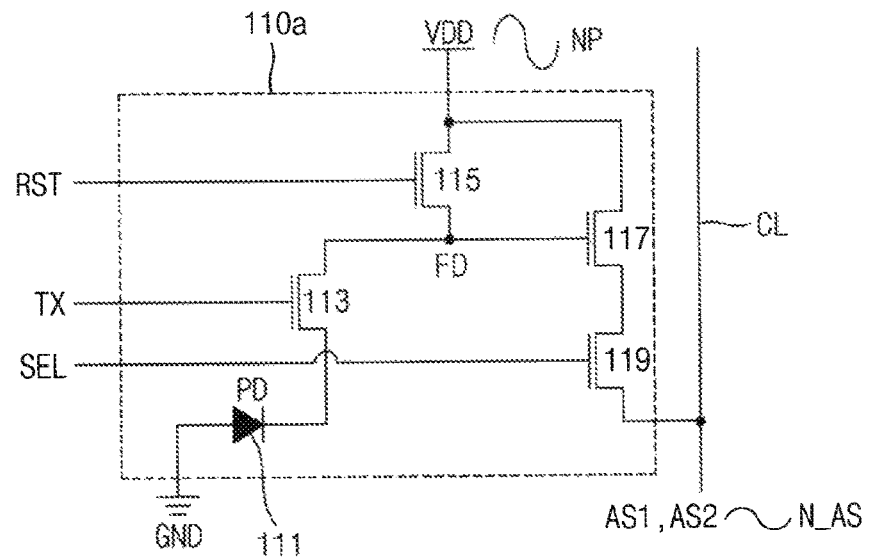
FIG. 3 illustrates a circuit diagram of an example of a unit pixel included in the pixel array in FIG. 2.

FIG. 3 illustrates a circuit diagram of an example of a unit pixel included in the pixel array in FIG. 2.

Referring to FIG. 3, a unit pixel 110a includes a photo detector (or, a photo sensitive device) (PD) 111, a transfer transistor 113, a reset transistor 115, a sensing transistor 117 and a selection transistor 119.

The photo detector 111 has a first terminal coupled to a ground voltage GND and converts an incident light to an electric signal. The transfer transistor 113 is coupled to a second terminal of the photo detector 111 and a floating diffusion node FD, and has a gate connected to the transfer control signal TX. The reset transistor 115 is coupled between a power supply voltage VDD (which includes the first noise component NP) and the floating diffusion node FD, and has a gate connected to the reset control signal RST. The sensing transistor 117 is coupled to the power supply voltage VDD and has a gate coupled to the floating diffusion node FD. The selection transistor 119 is coupled to the sensing transistor 117 and a corresponding column line CL, and has a gate connected to the selection control signal SEL. In FIG. 3, the first analog signal AS1 and the second analog signal AS2 include the second noise component denoted as N_AS.

Figure 4:
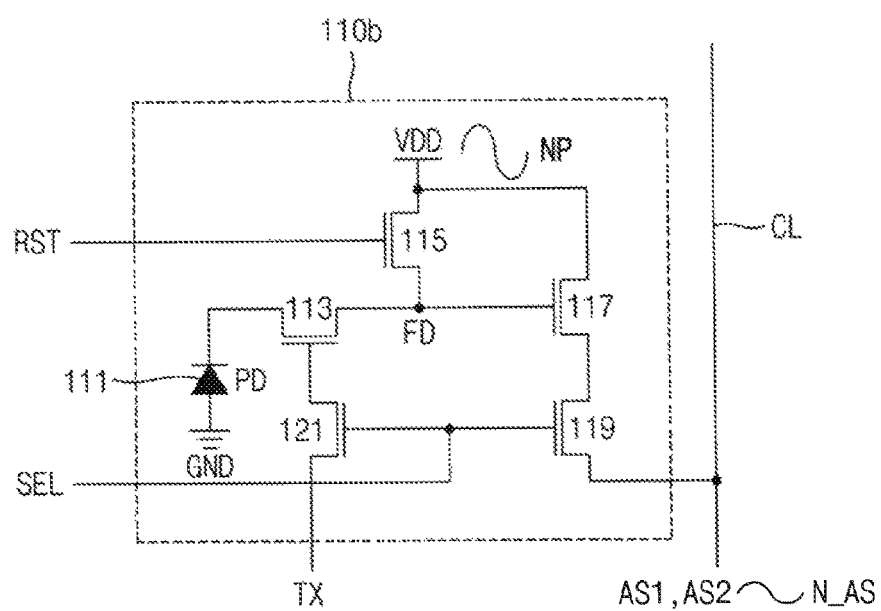
FIG. 4 illustrates a circuit diagram of another example of a unit pixel included in the pixel array in FIG. 2.

FIG. 4 illustrates a circuit diagram of another example of a unit pixel included in the pixel array in FIG. 2. Unit pixel 110b of FIG. 4 includes similar components as unit pixel 110a of FIG. 3. The following will therefore focus on differences between unit pixel 110a and unit pixel 110b, and description of like components will be omitted.

Unit pixel 110b of FIG. 4 differs from the unit pixel 110a in that the unit pixel 110b further includes a transistor 121. The transistor 121 has a first terminal coupled to a gate of the transfer transistor 113, a gate coupled to a gate of the selection transistor 119 and the selection control signal SEL, and a second terminal connected to the transfer control signal TX.

Hereinafter, the operation of the unit pixel 110a will be described with reference to FIGS. 2 and 3. In the following, although operation of one of the unit pixels 110a of a selected row is described, it should be understood that the selection control signal SEL, the reset control signal RST and the transfer control signal TX are provided from the row driver 220 to all the pixel units 100 of the selected row.

The photo detector 111 detects the incident light to generate electron-hole pairs (EHP), and the EHPs are accumulated at a source node of the transfer transistor 113.

The row driver 220 provides an activated select control signal SEL to the pixel array 100 to turn on the row selection transistor 119 to select one of the rows included in the pixel array 100, and provides an activated reset control signal RST to the selected row to turn on the reset transistor 115. Therefore, an electric potential of the floating diffusion node FD may have a level of the power supply voltage VDD, and the sensing transistor 117 is consequently turned on so that the first analog signal AS1 representing the reset component is output from the unit pixel 110a. Then, the row driver 220 deactivates the reset control signal RST.

Thereafter, the row driver 220 provides an activated transfer control signal TX to the pixel array 100 to turn on the transfer transistor 113 so that the electrons of the EHPs accumulated in the source node of the transfer transistor 113 are transferred to the floating diffusion node FD. The electric potential of the floating diffusion node FD may vary depending on the quantity of the electrons of the EHPs, and the electric potential of a gate of the sensing transistor 117 may consequently also vary. If the selection transistor 119 is in a turn-on state, the second analog signal AS2 corresponding to the electric potential of the floating diffusion node FD is output from the unit pixel 110a.

The row driver 220 controls the unit pixels 110a of the pixel array 100 to sequentially output the first and second analog signals AS1 and AS2 row by row (i.e., by units of rows) by repeating the above operation with respect to subsequent rows. For example, the first and second analog signals AS1 and AS2 of unit pixels 110a of a first row are output, thereafter the first and second analog signals AS1 and AS2 of unit pixels 110a of a second row are output, and so on.

Referring again to FIG. 2, the timing controller 210 provides a count enable signal CNT_EN (second control signal CTL2) to the ramp signal generator 250 to control the operation of the ramp signal generator 250. The ramp signal generator 250 may generate the ramp signal VR which descends (decreases) with a constant slope during an active interval when the count enable signal CNT_EN is enabled.

Figure 5:
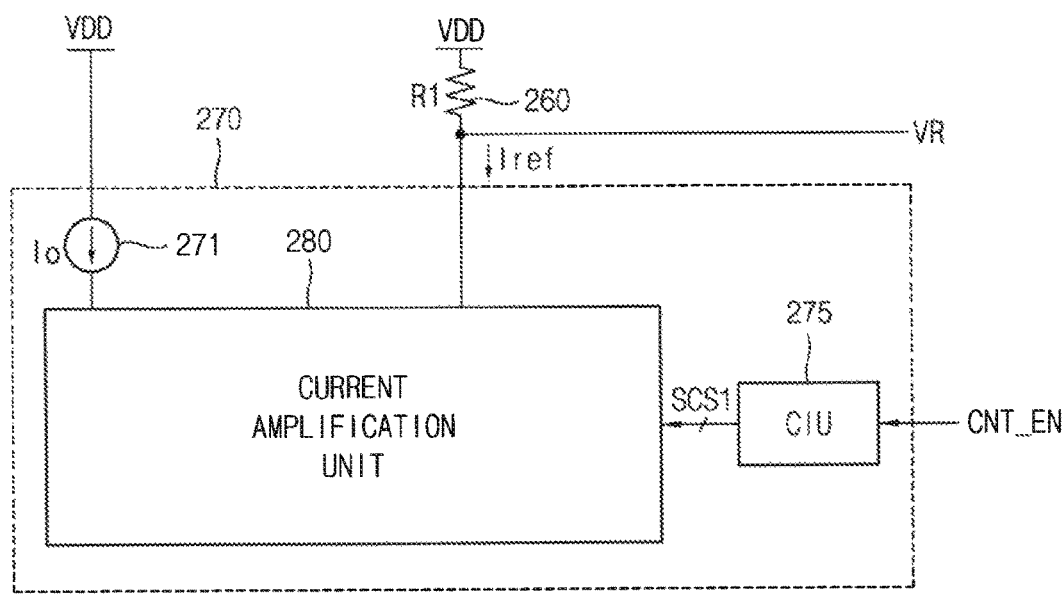
FIG. 5 illustrates a circuit diagram of an example of the ramp signal generator in FIG. 2.

FIG. 5 illustrates a circuit diagram of an example of the ramp signal generator in FIG. 2.

Referring to FIG. 5, the ramp signal generator 250 includes a resistor 260 and a current generating unit 270. The resistor 260 is connected between the power supply voltage VDD and the current generating unit 270 and may have a constant resistance value R.

The current generating unit 270 is connected between the resistor 260 and the ground voltage GND (not shown). The current generating unit 270 is connected to the count enable signal CNT_EN provided from the control circuit 200. The current generating unit 270 may generate the reference current Iref, which increases at a constant rate during the active interval where the count enable signal CNT_EN is enabled. The current generating unit 270 includes a constant current source 271, a current amplification unit 280 and a current control unit (CIU) 275.

The constant current source 271 generates a constant current Io having a constant magnitude. The current amplification unit 280 amplifies the constant current Io based on amplifying control signals SCS1 supplied from the current control unit 275. Although not illustrated in FIG. 5, the current amplification unit 280 may include a plurality switches and a plurality of current mirrors.

The current control unit 275 generates the amplifying control signals SCS1 based on the count enable signal CNT_EN and supplies the amplifying control signals SCS1 to the switches in the current amplification unit 280 to adjust the amplitude of the reference current Iref flowing through the resistor 260 by selectively turning on/off the switches.

The ramp signal generator 250 outputs the ramp signal VR from the node where the resistor 260 is connected to the current amplification unit 280.

The current control unit 275 opens all of the switches in the current amplification unit 280 to output the ramp signal VR having a maximum value and sequentially short-circuits the switches during the active interval when the count enable signal CNT_EN is enabled to descend (decrease) the magnitude of the ramp signal VR.

Referring again to FIG. 2, the timing controller 210 provides the third control signal CTL3 to the bias voltage generator 400 to control the operation of the bias voltage generator 400. The bias voltage generator 400 may adjust the magnitude of the AC component in the bias voltage VBP or VBN in response to the third control signal CTL3. The third control signal CTL may include a plurality of switching control signals and/or a sampling control signal as described below. In addition, the bias voltage generator 400 may generate a cascode voltage VCP or VCN in response to the third control signal CTL3 and may provide the cascode voltage VCP or VCN to the conversion block 300.

The timing controller 210 provides a count clock signal CLKC to the conversion block 300 to control the operation of the conversion block 300. The count clock signal CLKC may be a signal toggling during the active interval when the count enable signal CNT_EN is enabled. The count clock signal CLKC may be included in the fourth control signal CTL4.

The conversion block 300 generates the digital signal DGS representing the effective component of the incident light based on the first and second analog signals AS1 and AS2 sequentially provided from the pixel array 100.

The buffer sequentially outputs the digital signal DGS which are received from the conversion block 300 as image data IDTA and correspond to one row, based on the fifth control signal CTL5 received from the timing controller 210. The image data IDTA sequentially output from the buffer 190 may be provided to a digital signal processor.

Figure 6:
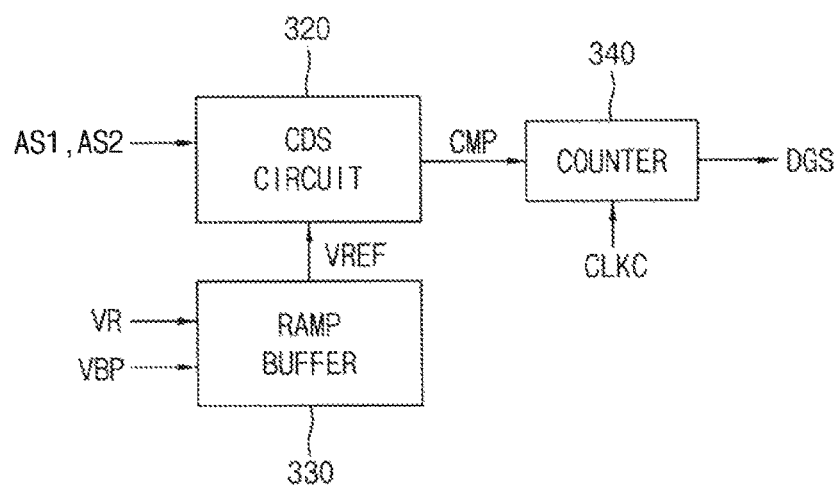
FIG. 6 illustrates a block diagram of one of the conversion circuits in FIG. 2.

FIG. 6 illustrates a block diagram of one of the conversion circuits in FIG. 2.

Referring to FIG. 6, the conversion circuit 310 includes a correlated double sampling (CDS) circuit 320, a ramp buffer 330 and a counter 340.

The ramp buffer 330 receives the ramp signal VR and the bias voltage VBP, and generates a reference voltage VREF based on the ramp signal VR and the bias voltage VBP.

The CDS circuit 320 generates a reset signal corresponding to the reset component and an image signal corresponding to the signal component by performing the correlated double sampling on the first and second analog signals AS1 and AS2, respectively based on the reference voltage VREF. In addition, the CDS circuit 320 generates a comparison signal CMP by comparing the reset signal and the image signal with the reference voltage VREF, respectively. For example, the CDS circuit 320 may output the comparison signal CMP with a logic high level when the reset signal or the image signal is smaller than the reference voltage VREF. The CDS circuit 320 may output the comparison signal CMP with a logic low level when the reset signal or the image signal is equal to or greater than the reference voltage VREF. As will be described subsequently, the bias generator 400 adjusts the AC component of the bias voltage VBP to in turn adjust the third noise component added to the reference voltage VREF may be adjusted to have a same magnitude as the magnitude of the second noise component in the first and second analog signals AS1 and AS2, respectively.

The counter 340 generates the digital signal DGS based on the comparison signal CMP and the count clock signal CLKC. For example, when the CDS circuit 320 outputs the comparison signal CMP by performing the correlated double sampling on the reset component, the counter 340 generates a first counting value by performing a counting operation in synchronization with the count clock signal CLKC until the comparison signal CMP transits to a logic low level. When the CDS circuit 320 outputs the comparison signal CMP by performing the correlated double sampling on the signal component, the counter 340 generates a second counting value by performing a counting operation in synchronization with the count clock signal CLKC until the comparison signal CMP transits to a logic low level. The counter 340 generates the digital signal DGS by subtracting the first counting value from the second counting value.

Figure 7:
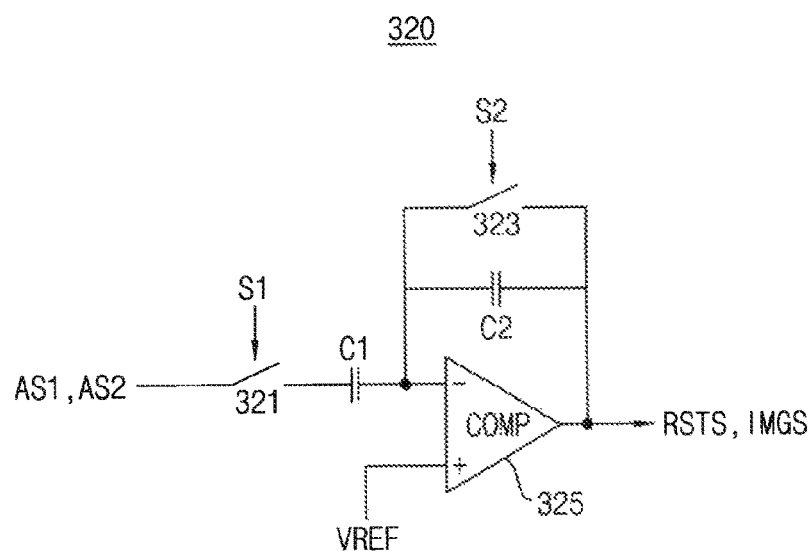
FIG. 7 illustrates an example of the correlated double sampling circuit in FIG. 6 according to an embodiment of the inventive concept.

FIG. 7 illustrates an example of the correlated double sampling circuit in FIG. 6 according to an embodiment of the inventive concept.

Referring to FIG. 7, the CDS circuit 320 includes a comparator 325, a first capacitor C1, a second capacitor C2, a first switch 321 and a second switch 323.

The first switch 321 samples the first analog signal AS1 or the second analog signal AS2 in response to a first switching control signal S1, and selectively provides the first and second analog signals AS1 and AS2 to the first capacitor C1.

The first capacitor C1 is connected between the first switch 321 and a negative input terminal of the comparator 325. The second switch 323 is connected between the negative input terminal of the comparator 325 and output terminal of the comparator 325, and is opened/closed in response to a second switching control signal S2. The second capacitor C2 is connected in parallel with the second switch 323.

The reference voltage VREF is applied to a positive input terminal of the comparator 325. The CDS circuit 320 may determine voltage levels of the reset signal RSTS and the image signal IMGS, or in other words the comparison signal, based on the reference voltage VREF.

Figure 8:
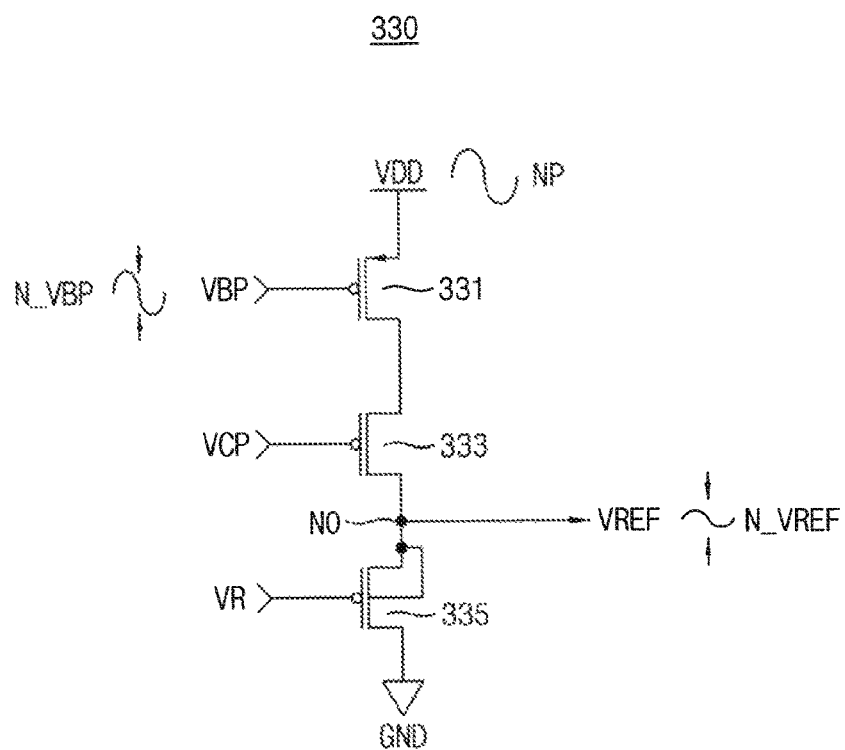
FIG. 8 illustrates a circuit diagram of the ramp buffer in the conversion circuit of FIG. 6 according an embodiment of the inventive concept.

FIG. 8 illustrates a circuit diagram of the ramp buffer in the conversion circuit of FIG. 6 according to an embodiment of the inventive concept.

Referring to FIG. 8, the ramp buffer 330 includes first through third p-channel metal oxide semiconductor (PMOS) transistors 331, 333 and 335 which are connected in series between the power supply voltage VDD (which includes the first noise component NP) and the ground voltage GND.

The first PMOS transistor 331 includes a source coupled to the power supply voltage VDD, a gate coupled to the bias voltage VBP and a drain coupled to the second PMOS transistor 333. The second PMOS transistor 333 includes a source coupled to the first PMOS transistor 331, a gate coupled to the cascode voltage VCP and a drain coupled to the third PMOS transistor 335. The third PMOS transistor 335 includes a source coupled to the second PMOS transistor 333 at an output node NO, a gate coupled to the ramp signal VR and a drain coupled to the ground voltage GND. A body of the third PMOS transistor 335 is coupled to the source of the third PMOS transistor 335 and the reference voltage VREF is output at the output node NO.

Therefore, a first noise component NP in the power supply voltage VDD is represented as a third noise component N_VREF in the reference voltage VREF after going through the first PMOS transistor 331 and the second PMOS transistor 333. The third noise component N_VREF in the reference voltage VREF may be adjusted by adjusting a magnitude (or a swing range) of a noise component N_VBP of the bias voltage VBP applied to the gate of first PMOS transistor 331. The third noise component N_VREF in the reference voltage VREF may be adjusted to have a same magnitude as the magnitude of the second noise component in the analog signal AS from the unit pixel 110a or 110b.

Figure 9:
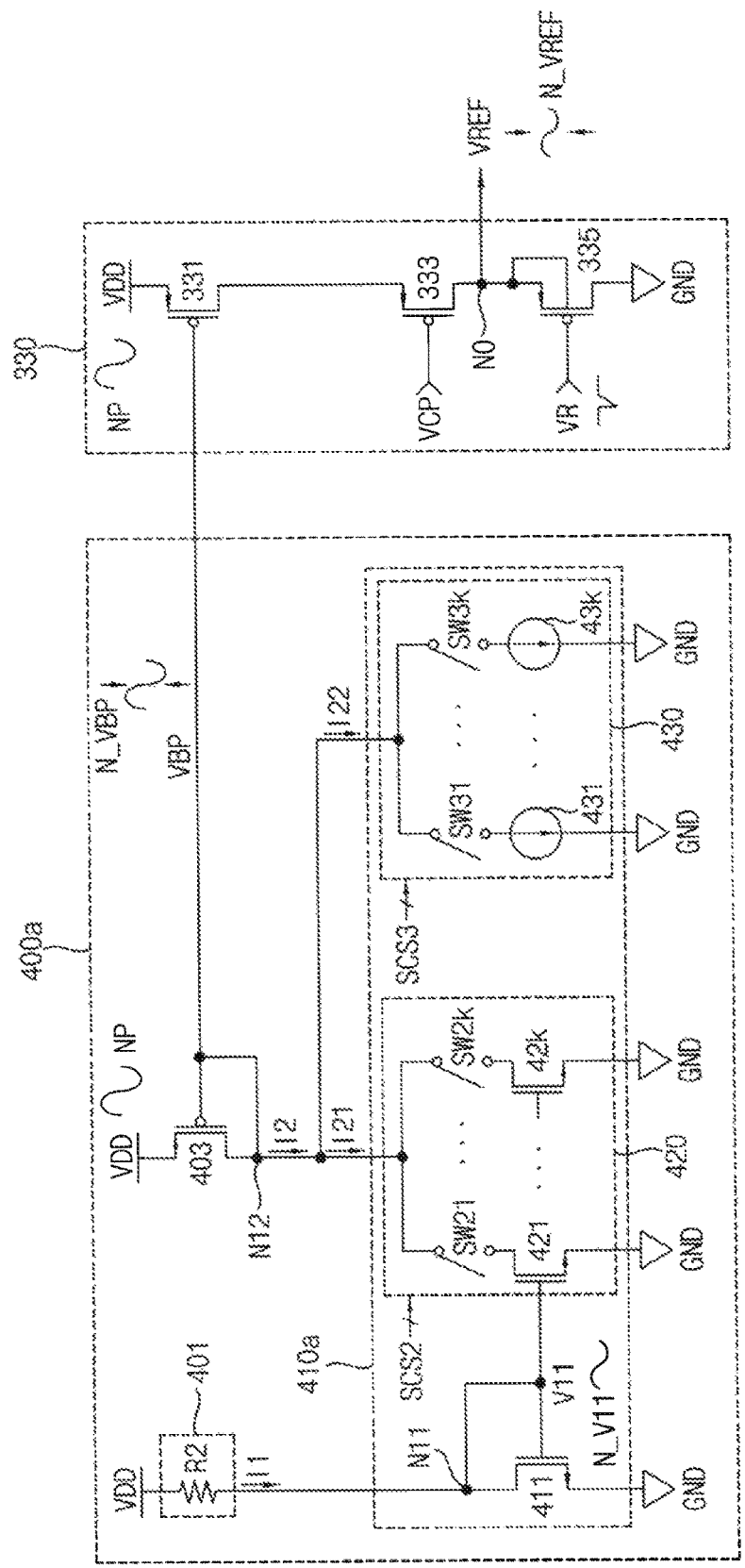
FIG. 9 illustrates a circuit diagram of an example of the bias voltage generator in FIG. 2 according to an embodiment of the inventive concept.

FIG. 9 illustrates a circuit diagram of an example of the bias voltage generator in FIG. 2 according to an embodiment of the inventive concept. In FIG. 9, the ramp buffer 330 of FIG. 8 is also illustrated with the bias voltage generator 400a for convenience of explanation.

Referring to FIG. 9, the bias voltage generator 400a includes a first current source 401, a current mirror 410a and a PMOS transistor 403.

The first current source 401 is connected between the power supply voltage VDD and a first node N11, and generates a first current I1 having a constant magnitude. The first current source 401 may be implemented with a resistor R2. The current mirror 410a is connected to the first node N11, the ground voltage GND and a second node N12, and outputs a second current I2 to the second node N12. The second current I2 corresponds to a sum of the first sub-current I21 and a second sub-current I22, and the first sub-current I21 is proportional to the first current I1. The PMOS transistor 403 is coupled between the power supply voltage VDD and the second node N12, and provides the ramp buffer 330 with the bias voltage VBP based on the second current I2. The current mirror 410a adjusts the AC component N_VBP of the bias voltage VBP by adjusting a ratio of the first sub-current I21 and the second sub-current I22.

The PMOS transistor 403 includes a source coupled to the power supply voltage VDD, and a drain and a gate which are coupled to the second node N12. The bias voltage VBP is output at the second node N12.

The current mirror 410a includes a first n-channel metal oxide semiconductor (NMOS) transistor 411, a first current generation circuit 420 and a second current generation circuit 430.

The first NMOS transistor 411 has a drain and a gate coupled to the first node N11, and a source coupled to the ground voltage GND. The first current generation circuit 420 is connected between the first node N11, the second node N12 and the ground voltage GND, and generates the first sub-current I21 whose magnitude varies in response to a first switching control signal SCS2. The second current generation circuit 430 is connected in parallel with the first current generation circuit 420 between the second node N12 and the ground voltage GND, and generates the second sub-current I22 whose magnitude varies in response to a second switching control signal SCS3.

The first current generation circuit 420 includes a plurality of first switches SW2l~SW2k each connected in series with corresponding ones of a plurality of second NMOS transistors 42l~42k. Each series connected pair of the plurality of first switches SW2l~SW2k and the plurality of second NMOS transistors 42l~42k are connected in parallel to the second node N12 and the ground voltage GND. The plurality of first switches SW2l~SW2k are connected to the second node N12, and the plurality of second NMOS transistors 42l~42k are connected to the ground voltage GND. Each of the first switches SW2l~SW2k are coupled to a corresponding bit of the first switching control signal SCS2 and each gate of the second NMOS transistors 42l~42k is coupled to the gate of the first NMOS transistor 411 at the first node N11.

The second current generation circuit 430 includes a plurality of second switches SW3l~SW3k each connected in series with corresponding ones of a plurality of second current sources 43l~43k. Each series connected pair of the plurality of second switches SW3l~SW3k and the plurality of second current sources 43l~43k are connected in parallel to the second node N12 and the ground voltage GND. The plurality of second switches SW3l~SW3k are connected to the second node N12, and the plurality of second current sources 43l~43k are connected to the ground voltage GND. Each of the switches SW3l~SW3k are coupled to a corresponding bit of the second switching control signal SCS3 and each of the second current sources 43l~43k generates a same constant current.

Therefore, the magnitude of the first sub-current I21 is proportional to the magnitude of the first current I1, and the sum of the first sub-current I21 and the second sub-current I22 corresponds to the second current I2. Accordingly, the magnitude of the first sub-current I21 and the magnitude of the second sub-current I22 are adjustable according to bit values of the first switching control signal SCS2 and the second switching control signal SCS3. The first and second switching control signals SCS2 and SCS3 may be part of the third control signal CTL3 provided from timing controller 210.

A voltage V11 of the first node N11 based on the first current I1 may include a direct current (DC) component and an AC component N_V11. Since the first current generation circuit 420 includes the second NMOS transistors 42l~42k and the second current generation circuit 430 includes the second current sources 43*l*~43*k* which generate constant currents, the AC component N_V11 of the voltage V11 may be adjusted by the magnitude of the first sub-current I21. Therefore, the AC component N_VBP of the bias voltage VBP based on the second current I2 may be adjusted by the ratio of the first sub-current I21 and the second sub-current I22, and the third noise component N_VREF of the reference voltage VREF may also be adjusted by the ratio of the first sub-current I21 and the second sub-current I22.

Figure 10:
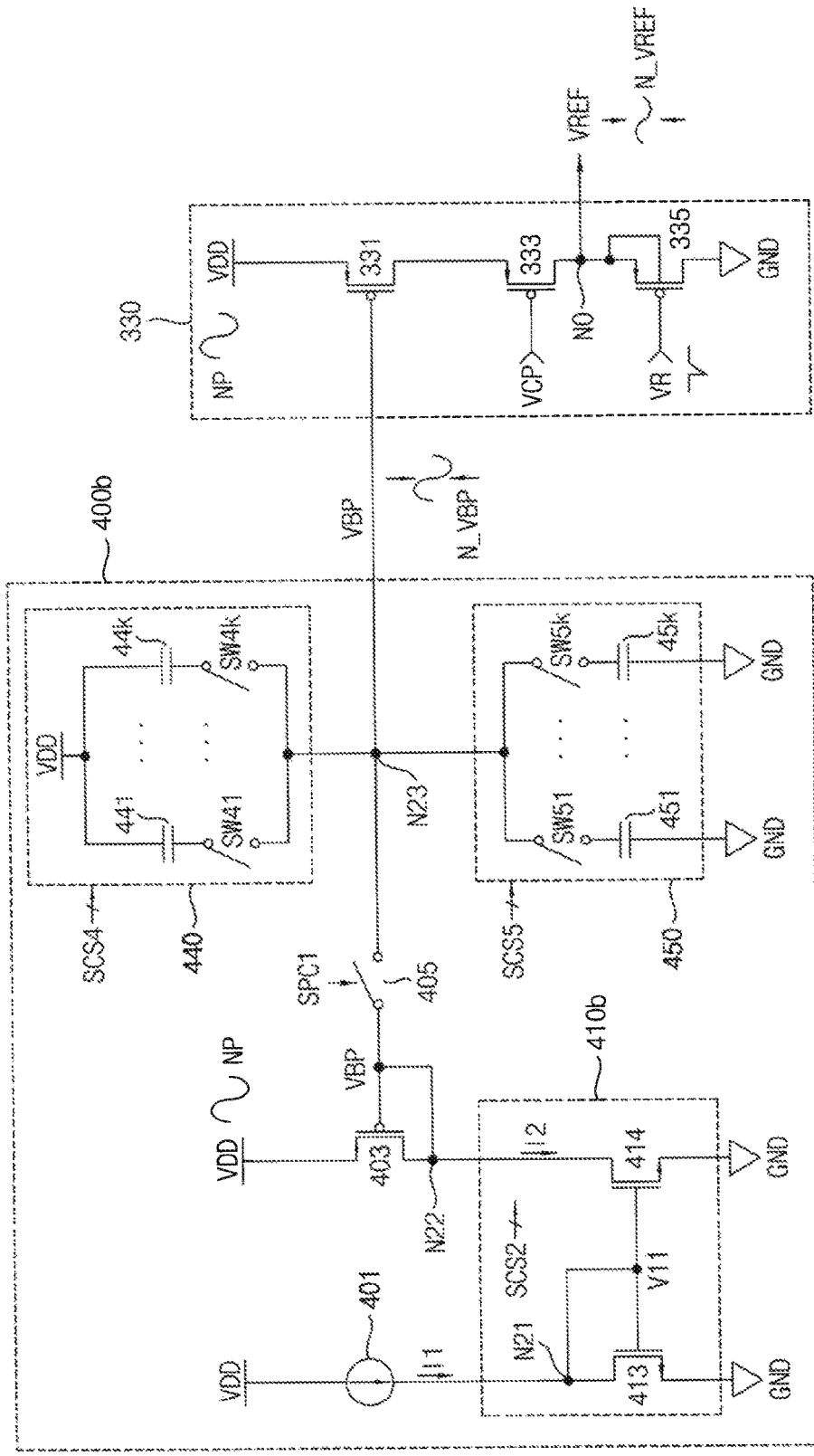
FIG. 10 illustrates a circuit diagram of another example of the bias voltage generator in FIG. 2 according an embodiment of the inventive concept.

FIG. 10 illustrates a circuit diagram of another example of the bias voltage generator in FIG. 2 according to an embodiment of the inventive concept. In FIG. 10, the ramp buffer 330 of FIG. 8 is also illustrated with a bias voltage generator 400*b* for convenience of explanation.

Referring to FIG. 10, the bias voltage generator 400*b* includes a current source 401, a current mirror 410*b*, a PMOS transistor 403, a sampling switch 405, a first sampling bank 440 and a second sampling bank 450.

The current source 401 is connected between the power supply voltage VDD and a first node N21, and generates a first current I1 having a constant magnitude. The current mirror 410*b* is connected to the first node N21, the ground voltage GND and a second node N22, and outputs a second current I2 having a same magnitude as the first current I1 to the second node N22 by mirroring the first current I1. The current mirror 410*b* includes NMOS transistors 413 and 414. The drain and the source of NMOS transistor 413 are respectively connected to the first node N21 and the ground voltage GND. The drain and the source of NMOS transistor 414 are respectively connected to the second node N22 and the ground voltage GND. The gates of NMOS transistors 413 and 414 are connected together to first node N21. A voltage V11 of the first node N21 is based on the first current I1. The PMOS transistor 403 includes a drain coupled to the power supply voltage VDD, and a source and a gate coupled to the second node N22. The PMOS transistor 403 provides the sampling switch 405 with the bias voltage VBP based on the second current I2.

The sampling switch 405 is connected between the second node N22 (a gate of the PMOS transistor 403) and a third node N23, and connects the bias voltage VBP to the third node N23 in response to a sampling control signal SPC1. The first sampling bank 440 is connected between the power supply voltage VDD and the third node N23, and samples a first portion of the bias voltage VBP therein in response to a first switching control signal SCS4. The second sampling bank 450 is connected between the third node N23 and the ground voltage GND, and samples a second portion of the bias voltage VBP therein in response to a second switching control signal SCS5.

The first sampling bank 440 includes a plurality of first capacitors 44*l*~44*k* each connected in series with corresponding ones of a plurality of first switches SW4*l*~SW4*k*. Each series connected pair of the plurality of first capacitors 44*l*~44*k* and the plurality of first switches SW4*l*~SW4*k* are connected in parallel to the power supply voltage VDD and the third node N23. The plurality of first capacitors 44*l*~44*k* are connected to the power supply voltage VDD, and the plurality of first switches SW4*l*~SW4*k* are connected to the third node N23. Each of the first switches SW4*l*~SW4*k* are coupled to a corresponding bit of the first switching control signal SCS4 and each of the first capacitors 44*l*~44*k* may have a same capacitance.

The second sampling bank 450 includes a plurality of second switches SW5*l*~SW5*k* each connected in series with corresponding ones of a plurality of second capacitors 45*l*~45*k*. Each series connected pair of the plurality of second switches SW5*l*~SW5*k* and the plurality of second capacitors 45*l*~45*k* are connected in parallel to the third node N23 and the ground voltage GND. The plurality of second switches SW5*l*~SW5*k* are connected to the third node N23, and the plurality of second capacitors 45*l*~45*k* are connected to the ground voltage GND. Each of the second switches SW5*l*~SW5*k* are coupled to a corresponding bit of the second switching control signal SCS5 and each of the second capacitors 45*l*~45*k* may have a same capacitance.

In other embodiments, each of the first sampling bank 440 and the second sampling bank 450 may be implemented with a variable capacitor.

The ratio of the first portion of the bias voltage VBP stored in the first capacitors 44*l*~44*k* and the second portion of the bias voltage VBP stored in the second capacitors 45*l*~45*k* may be varied according to the combination of bits of the first switching control signal SCS4 and bits of the second switching control signal SCS5. When it is assumed that the ground voltage GND includes little noise component because the ground voltage GND is stable, the magnitude of the AC component N_VBP of the bias voltage VBP may be adjusted by the ratio of the first portion of the bias voltage VBP stored in the sampling bank 440 and the second portion of the bias voltage VBP stored in the second sampling bank 450. Since the magnitude of the AC component N_VBP of the bias voltage VBP may be increased or decreased by the ratio of the first portion of the bias voltage VBP stored in the sampling bank 440 and the second portion of the bias voltage VBP stored in the second sampling bank 450, the magnitude of the third noise component N_VREF of the reference voltage VREF may be also adjusted accordingly.

In FIG. 10, the sampling control signal SPC1, the first switching control signal SCS4 and the second switching control signal SCS5 may be included in the third control signal CTL3 provided from the control circuit 200.

Figure 11:
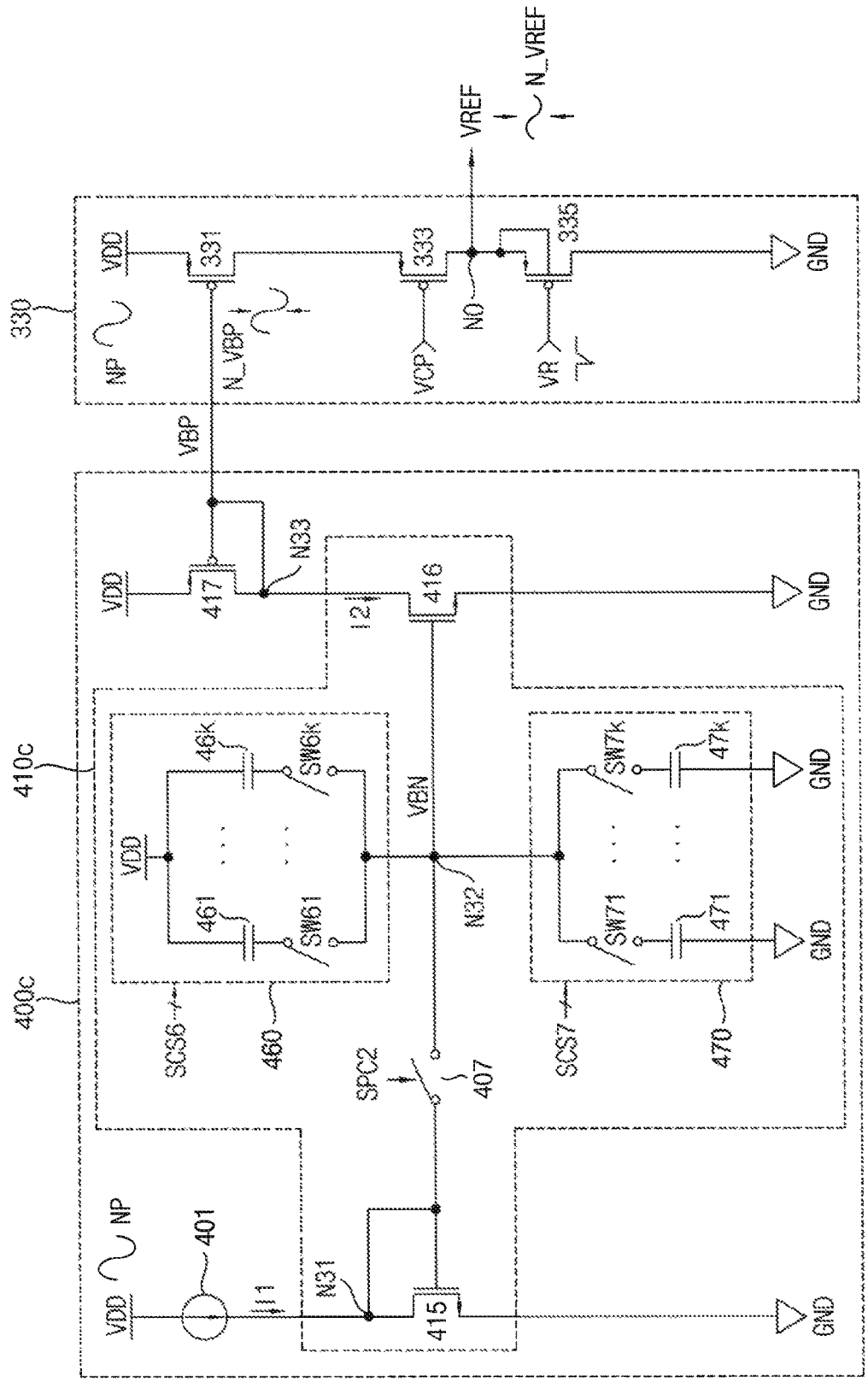
FIG. 11 illustrates a circuit diagram of another example of the bias voltage generator in FIG. 2 according to an embodiment of the inventive concept.

FIG. 11 illustrates a circuit diagram of another example of the bias voltage generator in FIG. 2 according to an embodiment of the inventive concept. In FIG. 11, the ramp buffer 330 of FIG. 8 is also illustrated with a bias voltage generator 400*c* for convenience of explanation.

Referring to FIG. 11, the bias voltage generator 400*c* includes a current source 401, a switched current mirror 410*c*, and a PMOS transistor 417.

The current source 401 is connected between the power supply voltage VDD and a first node N31, and generates a first current I1 having a constant magnitude. The switched current mirror 410*c* is connected to the first node N31, the power supply voltage VDD and a third node N33, and outputs a second current I2 proportional to the first current I1 to the third node N33 by mirroring first current I1 when a sampling switch 407 therein is turned on. The PMOS transistor 417 includes a source connected to the power supply voltage VDD, and a gate and a drain connected to the third node N33, and provides the ramp buffer 330 with the bias voltage VBP based on the second current I2.

The switched current mirror 410*c* includes a first NMOS transistor 415, the sampling switch 407, a first sampling bank 460, a second sampling bank 470 and a second NMOS transistor 416.

The first NMOS transistor 415 includes a drain and a gate coupled to the first node N31, and a source coupled to the ground voltage GND. The sampling switch 407 is connected between the first node N31 (a gate of the first NMOS transistor 415) and the second node N32, and provides a secondary bias voltage VBN at the second node N32 in response to a sampling control signal SPC2. The first sampling bank 460 is connected between the power supply voltage VDD and the second node N32, and samples a first portion of the secondary bias voltage VBN therein in response to a first switching control signal SCS6. The second sampling bank 470 is connected between the second node N32 and the ground voltage GND, and samples a second portion of the secondary bias voltage VBN therein in response to a second switching control signal SCS7. The second NMOS transistor 416 includes a gate coupled to the second node N32, a drain coupled to the third node N33 and a source coupled to the ground voltage GND. The gate of the second NMOS transistor 416 is connected to the secondary bias voltage VBN and draws the second current I2 in response to the secondary bias voltage VBN.

The first sampling bank 460 includes a plurality of first capacitors 46l~46k each connected in series with corresponding ones of a plurality of first switches SW6l~SW6k. Each series connected pair of the plurality of first capacitors 46l~46k and the plurality of first switches SW6l~SW6k are connected in parallel to the power supply voltage VDD and the second node N32. The plurality of first capacitors 46l~46k are connected to the power supply voltage VDD, and the plurality of first switches SW6l~SW6k are connected to the second node N32. Each of the first switches SW6l~SW6k are coupled to a corresponding bit of the first switching control signal SCS6 and each of the first capacitors 46l~46k may have a same capacitance.

The second sampling bank 470 includes a plurality of second switches SW7l~SW7k each connected in series with corresponding ones of a plurality of second capacitors 47l~47k. Each series connected pair of the plurality of second switches SW7l~SW7k and the plurality of second capacitors 47l~47k are connected in parallel to the second node N32 and the ground voltage GND. The plurality of second switches SW7l~SW7k are connected to the second node N32, and the plurality of second capacitors 47l~47k are connected to the ground voltage GND. Each of the second switches SW7l~SW7k are coupled to a corresponding bit of the second switching control signal SCS7 and each of the second capacitors 47l~47k may have a same capacitance.

In other embodiments, each of the first sampling bank 460 and the second sampling bank 470 may be implemented with a variable capacitor.

The ratio of the first portion of the secondary bias voltage VBNS stored in the first capacitors 46l~46k and the second portion of the secondary bias voltage VBNS stored in the second capacitors 47l~47k may be varied according to the combination of bits of the first switching control signal SCS6 and bits of the second switching control signal SCS7. When it is assumed that the ground voltage GND includes little noise component because the ground voltage GND is stable, the magnitude of the AC component N_VBP of the bias voltage VBP may be adjusted by the ratio of the first portion of the secondary bias voltage VBNS stored in the sampling bank 460 and the second portion of the secondary bias voltage VBNS stored in the second sampling bank 470.

Since the magnitude of the AC component N_VBP of the bias voltage VBP may be increased or decreased by the ratio of the first portion of the secondary bias voltage VBNS stored in the sampling bank 460 and the second portion of the secondary bias voltage VBNS stored in the second sampling bank 470, the magnitude of the AC component N_VBP of the bias voltage VBP based on the second current I2 is also increased or decreased, and the third noise component N_VREF of the reference voltage VREF may also be adjusted accordingly.

In FIG. 11, the sampling control signal SPC2, the first switching control signal SCS6 and the second switching control signal SCS7 may be included in the third control signal CTL3 provided from the control circuit 200.

Figure 12:
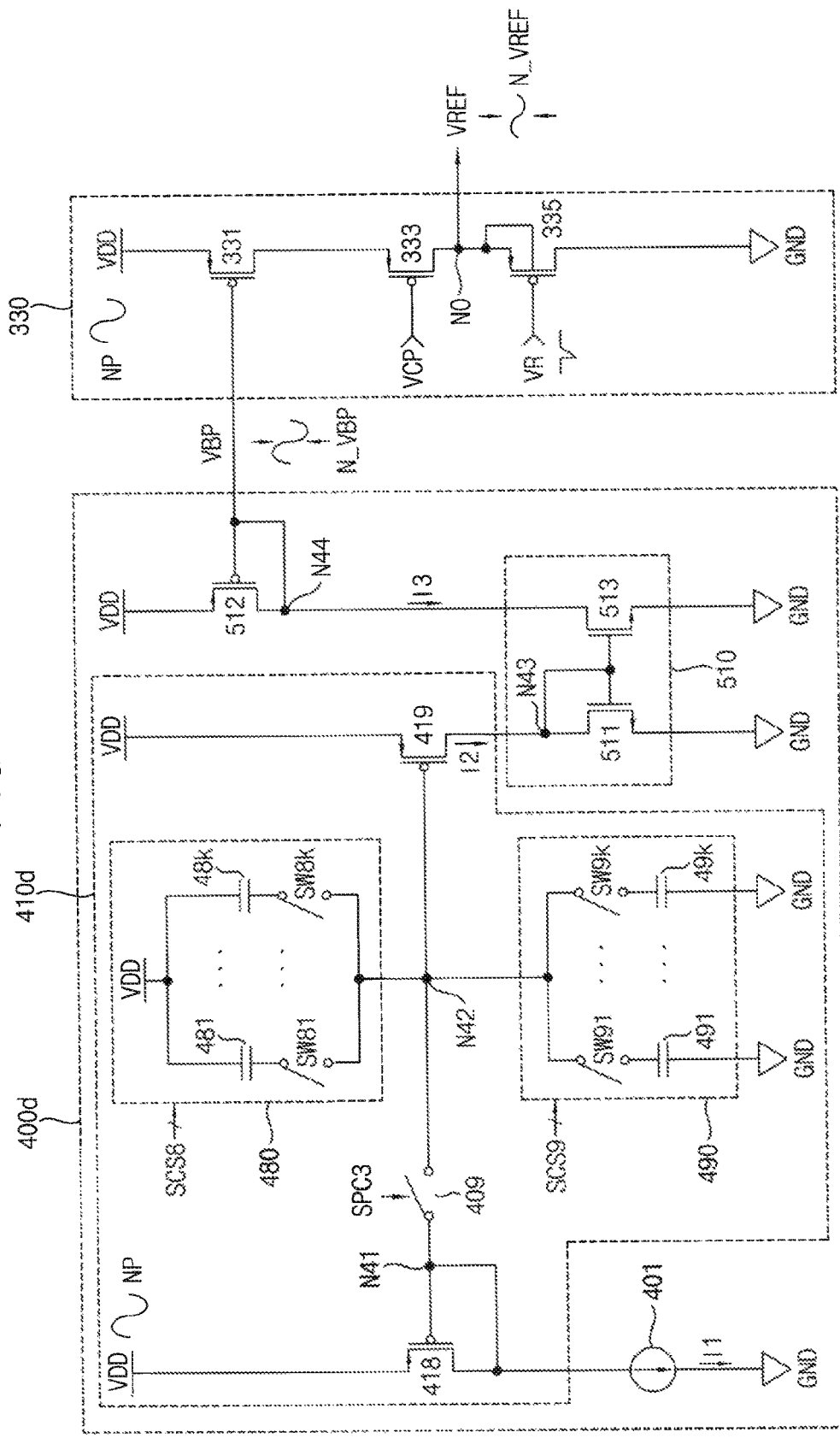
FIG. 12 illustrates a circuit diagram of another example of the bias voltage generator in FIG. 2 according to an embodiment of the inventive concept.

FIG. 12 illustrates a circuit diagram of another example of the bias voltage generator in FIG. 2 according to an embodiment of the inventive concept. In FIG. 12, the ramp buffer 330 of FIG. 8 is also illustrated with a bias voltage generator 400d for convenience of explanation.

Referring to FIG. 12, the bias voltage generator 400d includes a current source 401, a switched current mirror 410d, a current mirror 510 and a PMOS transistor 512.

The current source 401 is connected between a first node N41 and the ground voltage GND, and draws a first current I1 having a constant magnitude. The switched current mirror 410d is connected to the power supply voltage VDD, the first node N41, the ground voltage GND and a third node N43, and outputs a second current I2 proportional to the first current I1 to the third node N43 by mirroring first current I1 when a sampling switch 409 therein is switched on. The current mirror 510 is connected to the third node N43, the ground voltage GND and the fourth node N44, and mirrors the second current I2 to output the third current I3 proportional to the second current I2 to the fourth node N44. The PMOS transistor 512 includes a source connected to the power supply voltage VDD, and a gate and a drain connected to the fourth node N44. The PMOS transistor 512 provides the ramp buffer 330 with the bias voltage VBP based on the third current I3.

The switched current mirror 410d includes a PMOS transistor 418, the sampling switch 409, a first sampling bank 480, a second sampling bank 490 and a PMOS transistor 419.

The PMOS transistor 418 has a source coupled to the power supply voltage VDD, and a gate and a drain coupled to the first node N41. The sampling switch 409 is connected between the first node N41 (a gate of the PMOS transistor 418) and the second node N42, and connects a voltage of the first node N41 to the second node N42 in response to a sampling control signal SPC3. The first sampling bank 480 is connected between the power supply voltage VDD and the second node N42, and samples a first portion of a voltage of the second node N42 therein in response to a first switching control signal SCS8. The second sampling bank 490 is connected between the second node N42 and the ground voltage GND, and samples a second portion of the voltage of the second node N42 therein in response to a second switching control signal SCS9. The PMOS transistor 419 includes a gate coupled to the second node N42, a source coupled to the power supply voltage VDD and a drain coupled to the third node N43.

The first sampling bank 480 includes a plurality of first capacitors 48l~48k each connected in series with corresponding ones of a plurality of first switches SW8l~SW8k. Each series connected pair of the plurality of first capacitors 48l~48k and the plurality of first switches SW8l~SW8k are connected in parallel to the power supply voltage VDD and the second node N42. The plurality of first capacitors 48l~48k are connected to the power supply voltage VDD, and the plurality of first switches SW8l~SW8k are connected to the second node N42. Each of the first switches SW8l~SW8k are coupled to a corresponding bit of the first switching control signal SCS8 and each of the first capacitors 48l~48k may have a same capacitance.

The second sampling bank 490 includes a plurality of second switches SW9l~SW9k each connected in series with corresponding ones of a plurality of second capacitors 49l~49k. Each series connected pair of the plurality of second switches SW91-SW9k and the plurality of second capacitors 49l~49k are connected in parallel to the second node N42 and the ground voltage GND. The plurality of second switches SW9l~SW9k are connected to the second node N42, and the plurality of second capacitors 49l~49k are connected to the ground voltage GND. Each of the second switches SW9l~SW9k are coupled to a corresponding bit of the second switching control signal SCS9 and each of the second capacitors 49l~49k may have a same capacitance.

In other embodiments, each of the first sampling bank 480 and the second sampling bank 490 may be implemented with a variable capacitor.

The current mirror 510 includes NMOS transistors 511 and 513. The NMOS transistor 511 has a drain and a gate coupled to the third node N43, and a source coupled to the ground voltage GND. The NMOS transistor 513 has a drain coupled to the fourth node N44, a gate coupled to the third node N43 and a source coupled to the ground voltage GND.

The ratio of a first portion of the voltage of the second node N42 stored in the first capacitors 48l~48k and a second portion of the voltage of the second node N42 stored in the second capacitors 49l~49k may be varied according to the combination of bits of the first switching control signal SCS8 and bits of the second switching control signal SCS9. When it is assumed that the ground voltage GND includes little noise component because the ground voltage GND is stable, a magnitude of a noise component of the voltage of the second node N42 may be adjusted by the ratio of the first portion of the voltage of the second node N42 stored in the sampling bank 480 and the second portion of the voltage of the second node N42 stored in the second sampling bank 490. Since the magnitude of the noise component of the voltage of the second node N42 may be increased or decreased by the ratio of the first portion of the voltage of the second node N42 stored in the sampling bank 480 and the second portion of the voltage of the second node N42 stored in the second sampling bank 490, the magnitude of the AC component N_VBP of the bias voltage VBP based on the third current I3 is also increased or decreased, and the third noise component N_VREF of the reference voltage VREF may also be adjusted accordingly.

Figure 13:
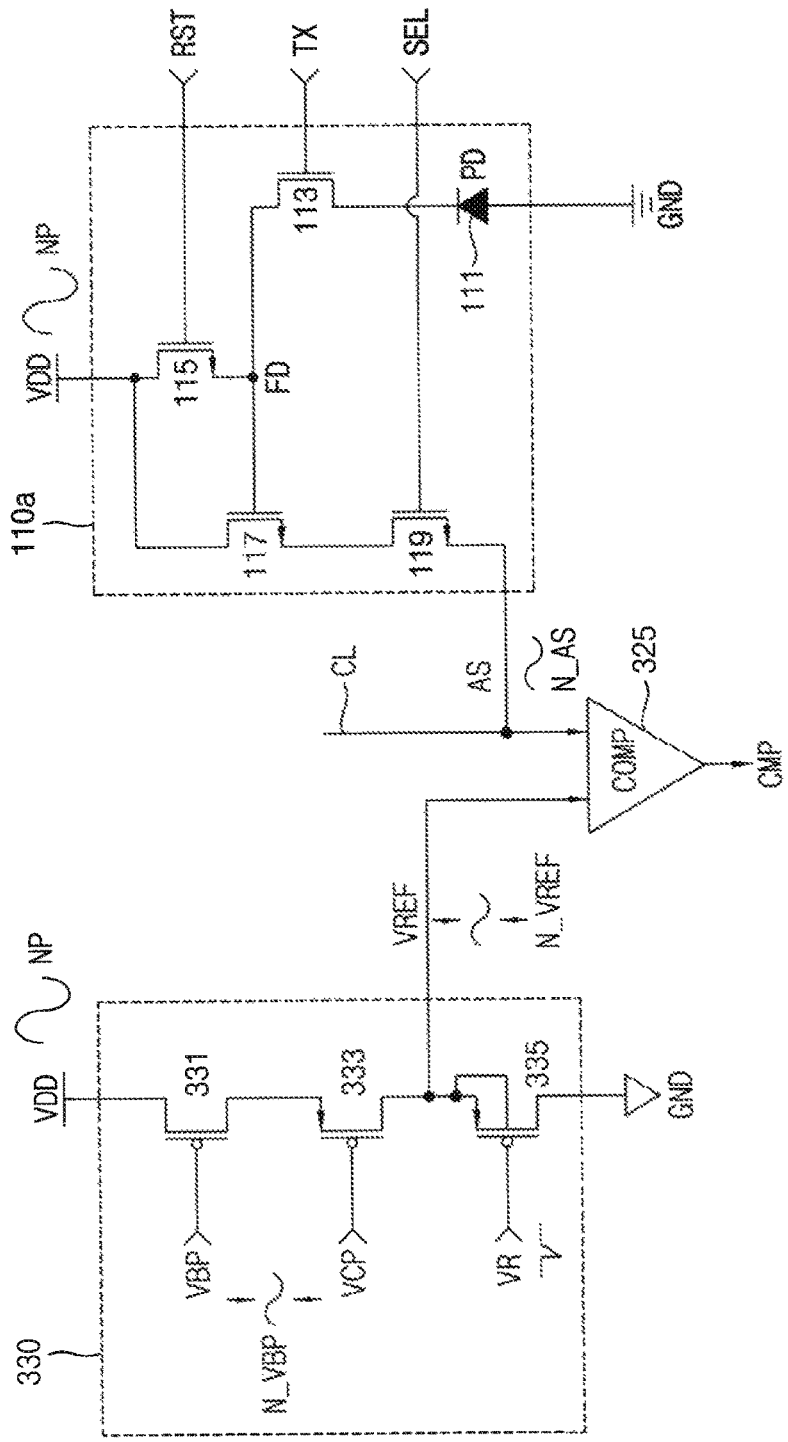
FIG. 13 illustrates a diagram for explaining a concept of the inventive concept.

FIG. 13 illustrates a diagram for explaining a concept of the present inventive concept.

In FIG. 13, the unit pixel 110a of FIG. 3, the ramp buffer 330 of FIG. 8 and the comparator 325 of the CDS circuit 320 shown in FIG. 7 are illustrated.

Referring to FIG. 13, the power supply voltage VDD to which the ramp buffer 330 is coupled includes the first noise component NP, and the bias voltage VBP which is applied to the first PMOS transistor 331 includes the AC component N_VBP. As described with reference to FIGS. 9 through 12, the bias voltage generator 400 adjusts the AC component N_VBP of the bias voltage VBP such that the magnitude of the third noise component N_VREF added to the reference voltage VREF which is output at the output node NO is substantially similar with the magnitude of a second noise component N_AS of the analog signal AS which is output from the unit pixel 110a. The comparator 325 of the CDS circuit 320 compares the reference voltage VREF and the analog signal AS to output the comparison signal CMP, and the third noise component N_VREF added to the reference voltage VREF and a second noise component N_AS of the analog signal AS cancel each other. Therefore, the comparison signal CMP includes none of the noise components.

Figure 14:
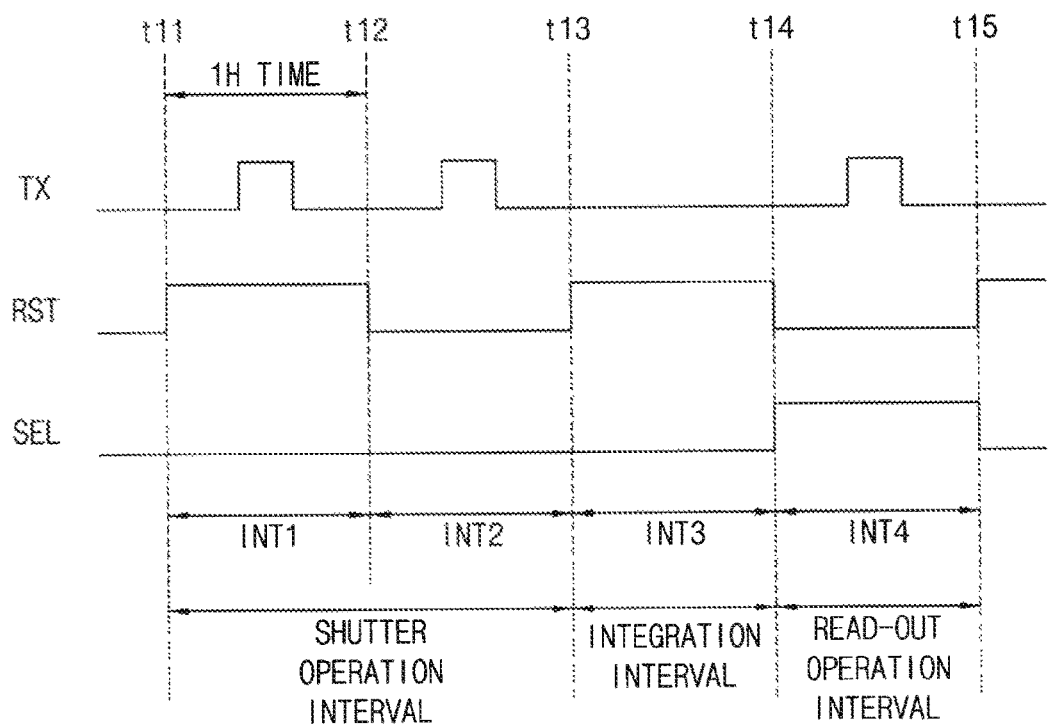
FIG. 14 illustrates a timing diagram explanatory of operation of the row driver and the pixel array in the image sensor of FIG. 2.

FIG. 14 illustrates a timing diagram of operation of the row driver and the pixel array in the image sensor of FIG. 2.

Referring to FIGS. 2, 3 and 14, the row driver 220 may sequentially scan a plurality of rows of unit pixels 110 based on the first internal control signal ICTL1 and the address signal ADDR, and may sequentially perform an electronic shutter operation to reset an electric signal already stored in each of the unit pixels 110 and a read-out operation to read-out the electric signal stored in each of the unit pixels 110. The row driver 220 performs the electronic shutter operation and the read-out operation by applying the transfer control signal TX, the reset control signal RST and the selection control signal SEL. The electronic shutter operation may include a preliminary shutter operation and a main shutter operation which are sequentially performed on one row. The row driver 220 may overlap a period of the main shutter operation on a first row of the plurality of rows and a period of the preliminary shutter operation on a second row, different from the first row, of the plurality of rows. For example, at least a portion of the main shutter operation of the first row and the preliminary shutter operation on the second row may be overlapped, or the main shutter operation of the first row and the preliminary shutter operation on the second row may be overlapped with each other. The row driver 220 performs the electronic shutter operation to eliminate (reset) signal charges accumulated in the photo detector before performing the read-out operation.

In FIG. 14, each time interval t11~t12, t12~t13, t13~t14 and t14~t15 may correspond to one horizontal scanning time (1H) required for the row driver 220 to scan one row. The row driver 220 may perform a preliminary shutter operation on one row within a first 1H time and perform a main shutter operation on the one row within a second 1H time after the first 1H time.

In FIG. 14, an interval between times t11~t13 may correspond to an electronic shutter interval during which the electronic shutter operation is performed, an interval between times t13~t14 may correspond to an integration interval INT3 during which electric signal is accumulated in the unit pixel 110, and an interval between times t14~t15 may correspond to a read-out interval INT4 during which the read-out operation is performed. The electronic shutter interval includes a preliminary shutter interval INT1 during which the preliminary shutter operation is performed and a main shutter interval INT2 during which the main shutter operation is performed.

Figure 15:
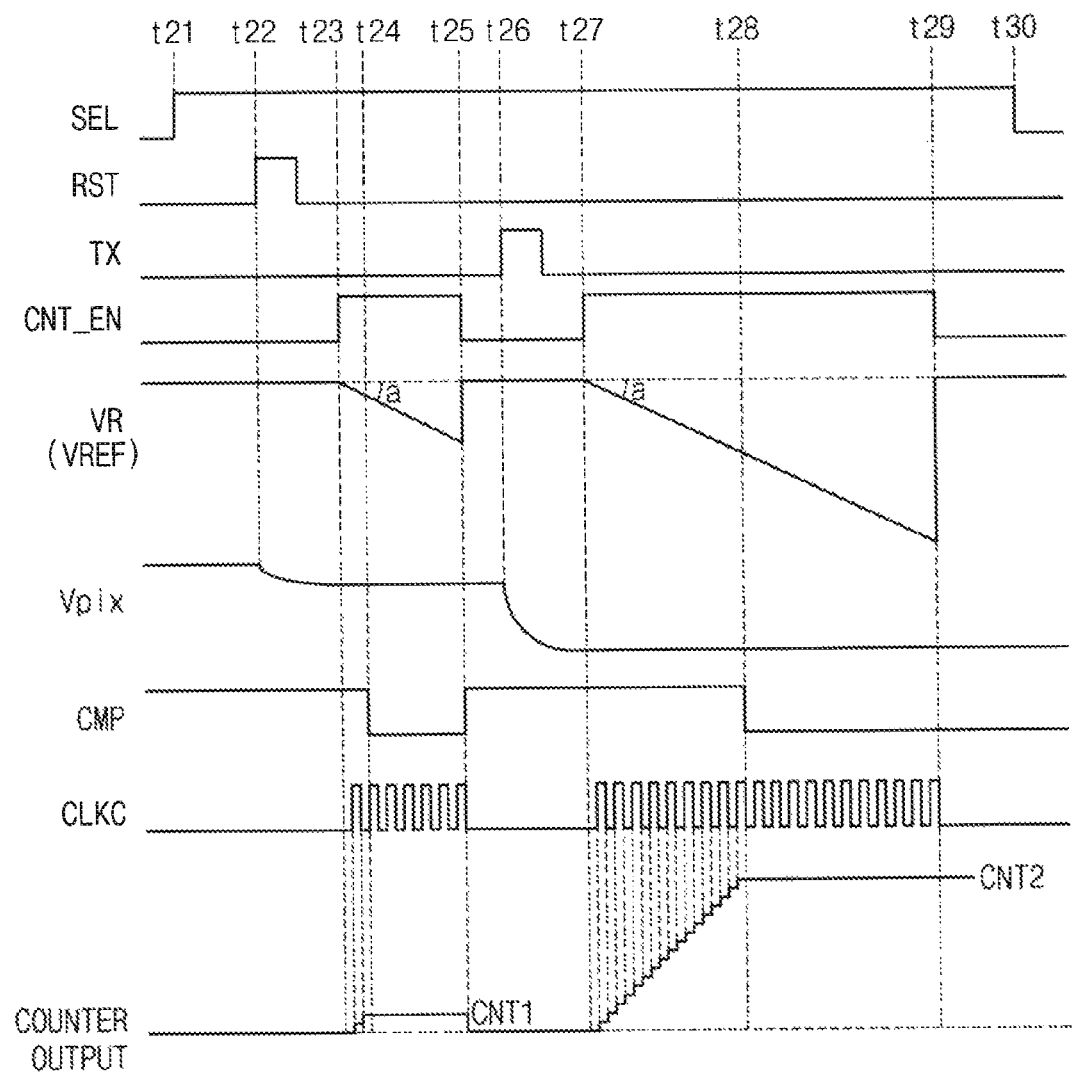
FIG. 15 illustrates a timing diagram explanatory of the operation of the image sensor of FIG. 1.

FIG. 15 illustrates a timing diagram for explaining the operation of the image sensor of FIG. 1. Hereinafter, the operation of the image sensor 10 of FIG. 1 will be described with reference to FIGS. 1 through 15.

At a time t21, the row driver 220 provides the selection control signal SEL, which is activated to have a logic high level, to the pixel array 100 to select one of the rows included in the pixel array 100.

At a time t22, the row driver 220 provides the reset control signal RST to the selected row. At this time, a pixel voltage signal Vpix output from the pixel array 100 may be the first analog signal AS1 representing the reset component.

At a time t23, the timing controller 210 provides the count enable signal CNT_EN having the logic high level to the ramp signal generator 250, and the ramp signal generator 250 starts to reduce the voltage level of the ramp signal VR at a constant slope (a). In addition, the timing controller 210 provides the count clock signal CLKC to the counter 340, and the counter 340 performs the counting operation in synchronization with the count clock signal CLKC.

At a time t24, the ramp signal VR and the reset signal (i.e., the first analog signal AS1 representing the reset component) have the same voltage level, and the comparison signal CMP output from the comparator 325 transits to a logic low level so that the counting operation is terminated. At this time, the counter 340 generates a first counting value CNT1 corresponding to the reset signal RSTS.

At a time t25, the count enable signal CNT_EN is deactivated to have a logic low level, and the ramp signal generator 250 is disabled. The interval from the time t23 to the time point t25 may represent a maximum interval to count the reset signal, and may be appropriately set to correspond to a number of clock cycles according to the characteristics of the image sensor 10.

At a time t26, the row driver 220 provides the transfer control signal TX to the selected row. At this time, a pixel voltage signal Vpix output from the pixel array 100 may be the second analog signal AS2 representing the image component (i.e., the image signal).

At a time t27, the timing controller 210 provides again the count enable signal CNT_EN having a logic high level to the ramp signal generator 250, and the ramp signal generator 250 starts to reduce the voltage level of the ramp signal VR at a constant slope (a) identical to the slope at the time t23. In addition, the timing controller 210 provides the count clock signal CLKC to the counter 340, and the counter 340 performs the counting operation in synchronization with the count clock signal CLKC.

At a time t28, the ramp signal VR and the image signal have the same voltage level, and the comparison signal CMP output from the comparator 325 transits to a logic low level so that the counting operation is terminated. At this time, the counter 340 generates a second count value CNT2 corresponding to the image signal IMGS. At this time, the comparison signal CMP includes none of noise components due to operations of the bias voltage generator 400 and the ramp buffer 330. The counter 340 may output the digital signal DGS representing the effective component of the incident light by subtracting the first count value CNT1 from the second count value CNT2.

At a time point t29, the count enable signal CNT_EN is deactivated to have a logic low level, the ramp signal generator 250 is disabled. The interval from the time t27 to the time t29 may represent a maximum interval to count the image signal, and may be appropriately set to correspond to a number of clock cycles according to the characteristics of the image sensor 10.

At a time t30, the row driver 220 provides the selection control signal SEL, which is deactivated to have a logic low level, to the pixel array 100 to cancel the selection for the selected row.

After the time t30, the image sensor 10 repeats the above operation with respect to other rows to output the digital signal DGS in units of row.

As described above, the read-out circuit and the image sensor including the read-out circuit may cancel noise components by adjusting the noise component of the reference voltage to have a substantially the same magnitude as a magnitude of a noise component of the analog signal which is output from the unit pixel.

Figure 16:
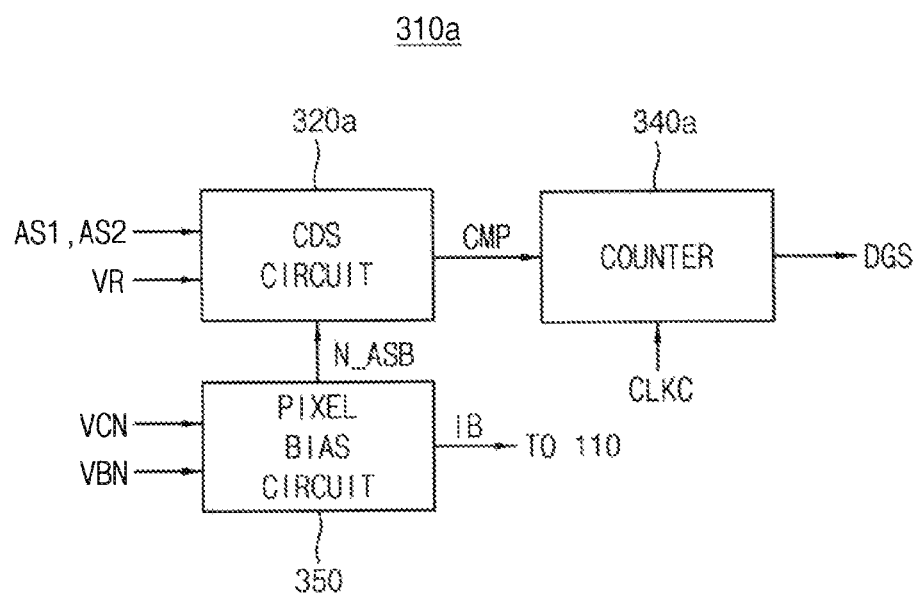
FIG. 16 illustrates a block diagram of one of the conversion circuits in FIG. 2.

FIG. 16 illustrates a block diagram of one of the conversion circuits in FIG. 2.

Referring to FIG. 16, a conversion circuit 310a includes a CDS circuit 320a, a pixel bias circuit 350 and a counter 340a.

The pixel bias circuit 350 receives the bias voltage VBN and the cascade voltage VCN and generates a bias current IB for driving the unit pixel 110 and a third noise component N_ASB for cancelling the second noise component N_AS based on the bias voltage VBN. The pixel bias circuit 350 provides the bias current IB to the unit pixel 110 and provides the third noise component N_ASB to a pixel node to which the unit pixel 110 is coupled.

The CDS circuit 320a generates a reset signal corresponding to the reset component and an image signal corresponding to the signal component by performing the correlated double sampling on the first and second analog signals AS1 and AS2, respectively based on the ramp signal VR. The pixel bias circuit 350 adjust an AC component of the bias voltage VBN such that the third noise component N_ASB cancels the second noise component N_AS.

Figure 17:
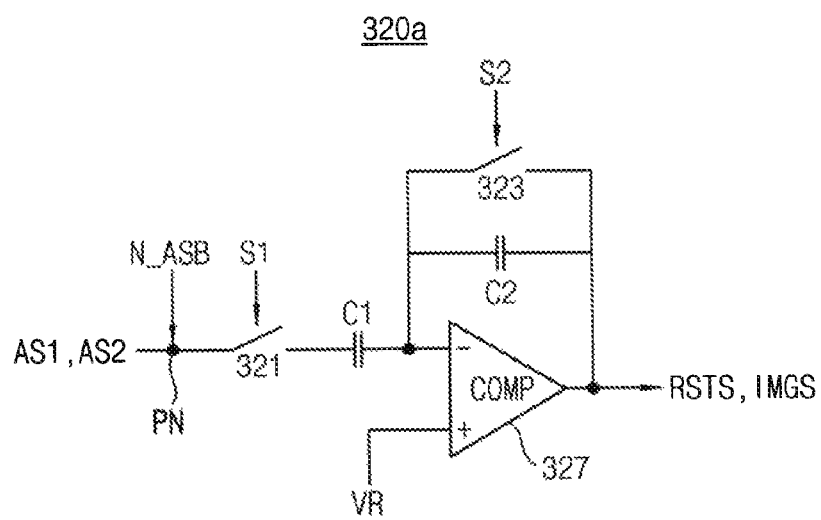
FIG. 17 illustrates an example of the correlated double sampling circuit in FIG. 16 according to an embodiment of the inventive concept

FIG. 17 illustrates an example of the correlated double sampling circuit in FIG. 16 according to an embodiment of the inventive concept.

Referring to FIG. 17, the CDS circuit 320a includes a comparator 321, a first capacitor C1, a second capacitor C2, a first switch 321 and a second switch 323.

The first switch 321 is connected to a pixel node PN and samples the first analog signal AS1 or the second analog signal AS2 in response to a first switching control signal S1, and selectively provides the first and second analog signals AS1 and AS2 to the first capacitor C1. The first capacitor C1 is connected between the first switch 321 and a negative input terminal of the comparator 327. The second switch 323 is connected between the negative input terminal of the comparator 327 and output terminal of the comparator 327, and is opened/closed in response to a second switching control signal S2. The second capacitor C2 is connected in parallel with the second switch 323.

The ramp signal VR is applied to a positive input terminal of the comparator 327. The CDS circuit 320a may determine voltage levels of the reset signal RSTS and the image signal IMGS, or in other words the comparison signal, based on the ramp signal VR. The third noise component N_ASB is provided to the pixel node PN and the second noise component N_AS of the first analog signal AS1 or the second analog signal AS2 is cancelled by the third noise component N_ASB at the pixel node PN.

Figure 18:
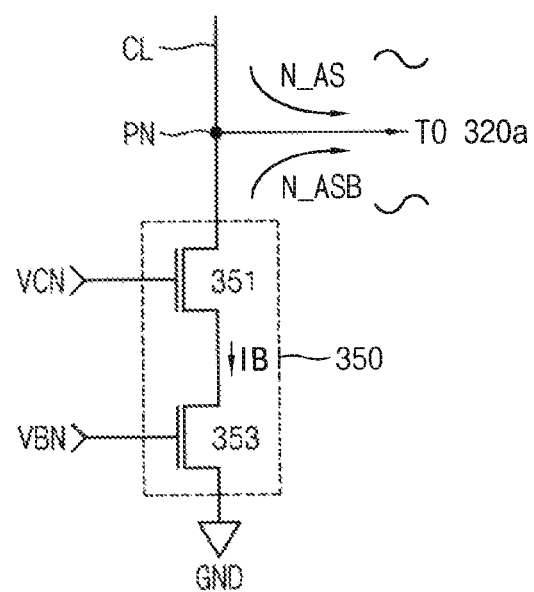
FIG. 18 illustrates a circuit diagram of the pixel bias circuit in the conversion circuit of FIG. 16 according to an embodiment of the inventive concept.

FIG. 18 illustrates a circuit diagram of the pixel bias circuit in the conversion circuit of FIG. 16 according to an embodiment of the inventive concept.

Referring to FIG. 18, the pixel bias circuit 350 includes NMOS transistors 351 and 353 connected in series between the pixel node PN and the ground voltage GND.

The NMOS transistor 351 includes a drain coupled to the pixel node PN, a gate coupled to the cascode voltage VCN and a source coupled to the NMOS transistor 353. The NMOS transistor 353 has a drain coupled to the NMOS transistor 351, a gate coupled to the bias voltage VBN and a source coupled to the ground voltage GND.

When the cascode voltage VCN is at a high level, a magnitude of the bias current IB which flows through the NMOS transistor 353 may be adjusted by the bias voltage VBN. In addition, the magnitude of the third noise component N_ASB may be adjusted by an AC component of the bias voltage VBN. Since a phase of the third noise component N_ASB is opposite to a phase of the second noise component N_AS, the third noise component N_ASB is adjusted to calcel the second nosie component N_AS. The pixel node PN is coupled to the unit pixel 110 through a column line CL.

Figure 19:
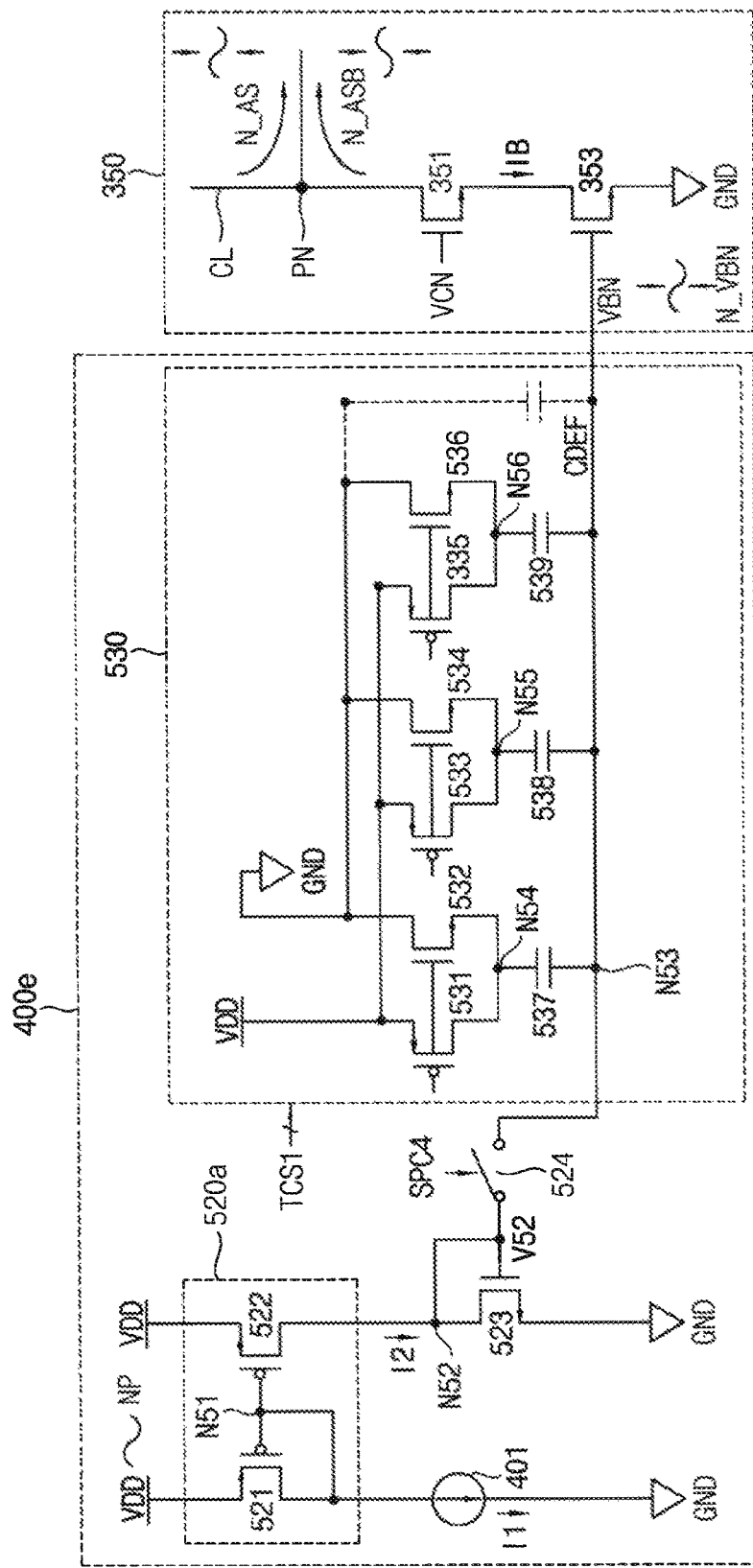
FIG. 19 illustrates a circuit diagram of another example of the bias voltage generator in FIG. 2 according to an embodiment of the inventive concept.

FIG. 19 illustrates a circuit diagram of another example of the bias voltage generator in FIG. 2 according to an embodiment of the inventive concept.

In FIG. 19, the pixel bias circuit 350 of FIG. 18 is also illustrated with a bias voltage generator 400e for convenience of explanation.

Referring to FIG. 19, the bias voltage generator 400e includes a current source 401, a current mirror 520a, an NMOS transistor 523, a sampling switch 524 and a tuning bank 530.

The current source 401 is connected between a first node N51 and the ground voltage GND, and draws a first current I1 having a constant magnitude. The current mirror 520a is connected to the power supply voltage VDD, the first node N51, and a second node N52 and outputs a second current I2 having a same magnitude as the first current I1 to the second node N52 by mirroring the first current I1. The drain and gate of the NMOS transistor 523 are coupled to the second node N52 and the source of the NMOS transistor 532 is coupled to the ground voltage GND.

The sampling switch 524 is connected between the second node N52 and a third node N53, and connects a voltage V52 due to the second current I2 to the third node N53, in response to a sampling control signal SPC4. The tuning bank 530 is connected to the power supply voltage VDD, the ground voltage GND and the third node N53, stores a portion of the voltage V52 therein in response to a tuning control signal TCS1 and provides the pixel bias circuit 350 with the stored voltage as the bias voltage VBN.

The tuning bank 530 includes a plurality of PMOS transistors 531, 533, and 535, a plurality of NMOS transistors 532, 534 and 536 and a plurality of capacitors 537, 538 and 539. The capacitors 537, 538 and 539 may be connected in parallel between the third node N53 and each of nodes (or, connection nodes) N54, N55 and N56. Each of the PMOS transistors 531, 533, and 535 is connected to the power supply voltage VDD and to each of the nodes N54, N55 and N56, and each of the NMOS transistors 532, 534 and 536 is connected to the ground voltage GND and to each of the nodes N54, N55 and N56. Each parallel connected pair of PMOS transistors 531, 533, and 535 and the NMOS transistors 532, 534 and 536 are alternatively turned-on/off in response to respective bit of the tuning control signal TCS1 and thus, the voltage V52 is stored in at least some of the capacitors 537, 538 and 539.

The capacitors 537, 538 and 539 have respective capacitances with a ratio of 1:2:4 with respect to one another and each parallel connected pair of PMOS transistors 531, 533, and 535 and the NMOS transistors 532, 534 and 536 are alternatively turned-on/off in response to respective bit of the tuning control signal TCS1. Therefore, the tuning bank 530 adjusts the magnitude of the bias voltage VBN stored therein according to bits of the tuning control signal TCS1, and adjusts the magnitude of an AC component N_VBN of the bias voltage VBN. Therefore, the pixel bias circuit 350 may adjust the magnitude of the third nose component N_ASB substantially same as the magnitude of the second nose component N_AS.

The tuning bank 530 may further include a reserve capacitor CDEF connected between the third node N53 and the ground voltage GND. The reserve capacitor CDEF stores the voltage V52 without regard to the tuning control signal TCS1.

In FIG. 19, the sampling control signal SPC4 and the tuning control signal TCS1 may be included in the third control signal CTL3 provided from the control circuit 200.

Figure 20:
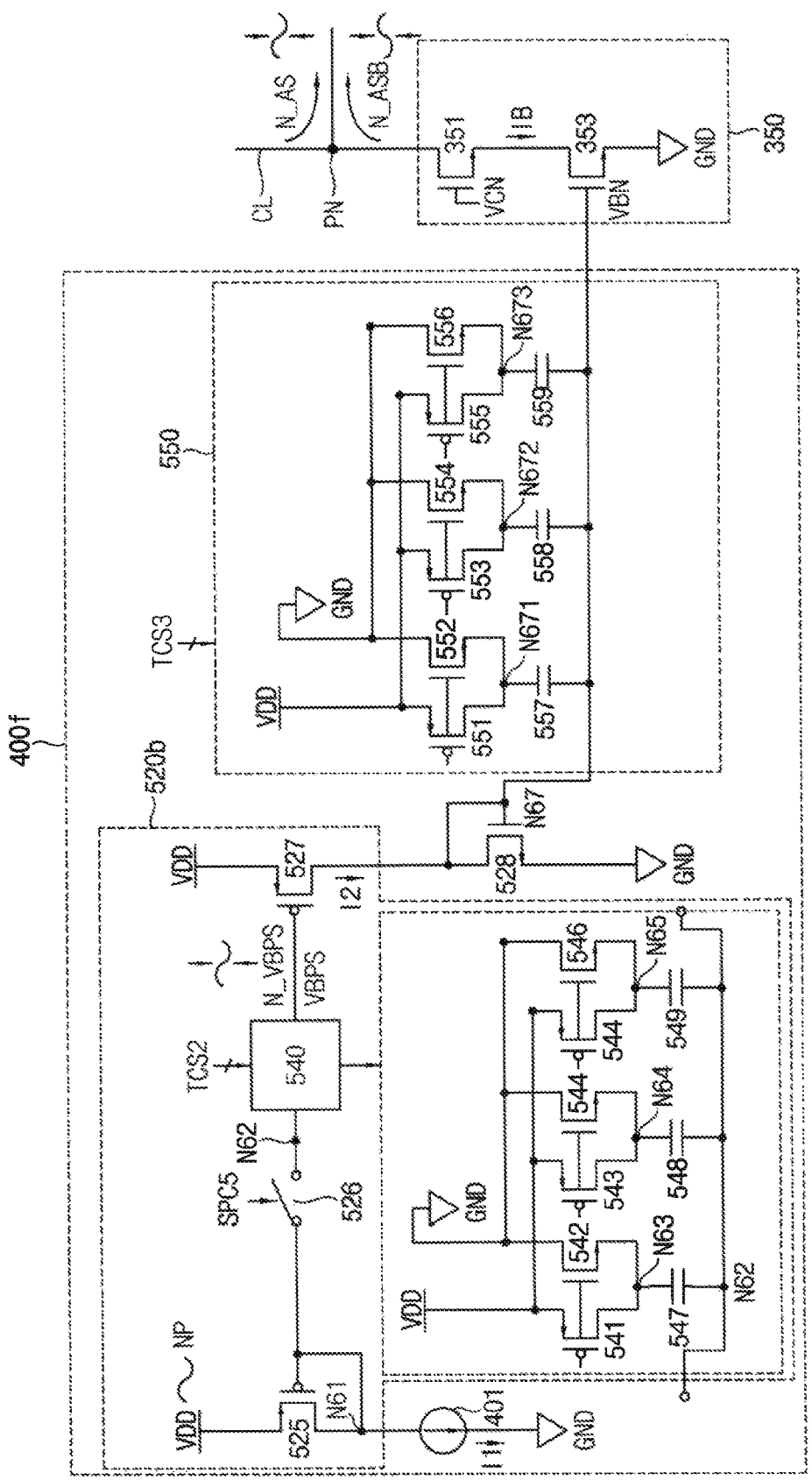
FIG. 20 illustrates a circuit diagram of another example of the bias voltage generator in FIG. 2 according to an embodiment of the inventive concept.

FIG. 20 illustrates a circuit diagram of another example of the bias voltage generator in FIG. 2 according to an embodiment of the inventive concept.

In FIG. 20, the pixel bias circuit 350 of FIG. 18 is also illustrated with a bias voltage generator 400f for convenience of explanation.

Referring to FIG. 20, the bias voltage generator 400f includes a current source 401, a switched current mirror 520b, an NMOS transistor 528 and a second tuning bank 550.

The current source 401 is connected between a first node N61 and the ground voltage GND, and draws a first current I1 having a constant magnitude.

The switched current mirror 520b is connected to the power supply voltage VDD, the first node N61, and a seventh node N67 and outputs a second current I2 having a same magnitude as the first current I1 to the seventh node N67 by mirroring the first current I1 when a sampling switch 526 therein is connected. The switched current mirror 520b includes a PMOS transistor 525, the sampling switch 526, a first tuning bank 540 and a PMOS transistor 527.

The PMOS transistor 525 includes a source coupled to the power supply voltage VDD and a gate and a drain coupled to the first node N61. The sampling switch 526 is coupled to the first node N61 and a second node N62, and provides a voltage of the first node N61 to the second node N62 in response to the sampling control signal SPC5. The first tuning bank 540 is connected to the power supply voltage VDD, the ground voltage GND, the second node N62 and a gate of the PMOS transistor 527, stores a portion of the voltage at the second node N62 therein in response to a tuning control signal TCS2 and provides the gate of the PMOS transistor 527 with the stored voltage as a secondary bias voltage VBPS.

The first tuning bank 540 includes a plurality of PMOS transistors 541, 543, and 545, a plurality of NMOS transistors 542, 544 and 546 and a plurality of capacitors 547, 548 and 549. The capacitors 547, 548 and 549 may be connected in parallel between the second node N62 and each of nodes N63, N64 and N65. Each of the PMOS transistors 541, 543, and 545 is connected to the power supply voltage VDD and to each of the nodes N63, N64 and N65, and each of the NMOS transistors 542, 544 and 546 is connected to the ground voltage GND and to each of the nodes N63, N64 and N65. Each parallel connected pair of PMOS transistors 541, 543, and 545 and the NMOS transistors 542, 544 and 546 are alternatively turned-on/off in response to respective bit of the tuning control signal TCS2 and thus, the voltage of the second node N62 is stored in at least some of the capacitors 547, 548 and 549.

The capacitors 547, 548 and 549 have respective capacitances with a ratio of 1:2:4 with respect to each other and each parallel connected pair of PMOS transistors 541, 543, and 545 and the NMOS transistors 542, 544 and 546 are alternatively turned-on/off in response to respective bit of the tuning control signal TCS2. Therefore, the first tuning bank 540 adjusts the magnitude of the secondary bias voltage VBPS stored therein according to bits of the tuning control signal TCS2, and adjusts the magnitude of an AC component N_VBPS of the secondary bias voltage VBPS. Therefore, the pixel bias circuit 350 may adjust the magnitude of the third nose component N_ASB substantially same as the magnitude of the second nose component N_AS.

The PMOS transistor 527 includes a source coupled to the power supply voltage VDD, a gate coupled to the first tuning bank 540 and a drain coupled to the seventh node N67. The PMOS transistor 527 provides the second current I2 at the drain.

The drain and gate of the NMOS transistor 528 are coupled to the seventh node N67 and the source of the NMOS transistor 538 is coupled to the ground voltage GND.

The second tuning bank 550 is connected to the power supply voltage VDD, the ground voltage GND and the pixel bias circuit 350, stores a portion of a voltage of the seventh node N67 therein in response to a tuning control signal TCS3 and provides the pixel bias circuit 350 with the stored voltage as the bias voltage VBN.

The second tuning bank 550 includes a plurality of PMOS transistors 551, 553, and 535, a plurality of NMOS transistors 552, 554 and 556 and a plurality of capacitors 557, 558 and 559. The capacitors 557, 558 and 559 may be connected in parallel between the seventh node N67 and each of nodes (connection nodes) N671, N672 and N673. Each of the PMOS transistors 551, 553, and 555 is connected to the power supply voltage VDD and to each of the nodes N671, N672 and N673 and each of the NMOS transistors 552, 554 and 556 is connected to the ground voltage GND and to each of the nodes N671, N672 and N673. Each parallel connected pair of PMOS transistors 551, 553, and 555 and the NMOS transistors 552, 554 and 556 are alternatively turned-on/off in response to respective bit of the tuning control signal TCS3 and thus, the voltage of the seventh node N67 caused by the second current I2 is stored in at least some of the capacitors 557, 558 and 559.

The capacitors 557, 558 and 559 have respective capacitances with a ratio of 1:2:4 with respect to each other and each parallel connected pair of PMOS transistors 551, 553, and 555 and the NMOS transistors 552, 554 and 556 are alternatively turned-on/off in response to respective bit of the tuning control signal TCS3. Therefore, the second tuning bank 550 adjusts the magnitude of the bias voltage VBN stored therein according to bits of the tuning control signal TCS1, and adjusts a phase of an AC component of the bias voltage VBN. Therefore, the pixel bias circuit 350 may adjust the phase of the third nose component N_ASB substantially opposite to the phase of the second nose component N_AS.

That is, in the bias voltage generator 400f of FIG. 20, the first tuning bank 540 adjusts the magnitude of the third nose component N_ASB and the second tuning bank 550 adjusts the phase of the third nose component N_ASB such that the second noise component N_AS is cancelled by the third nose component N_ASB.

In FIG. 20, the sampling control signal SPC5 and the tuning control signals TCS2 and TCS3 may be included in the third control signal CTL3 provided from the control circuit 200.

Figure 21:
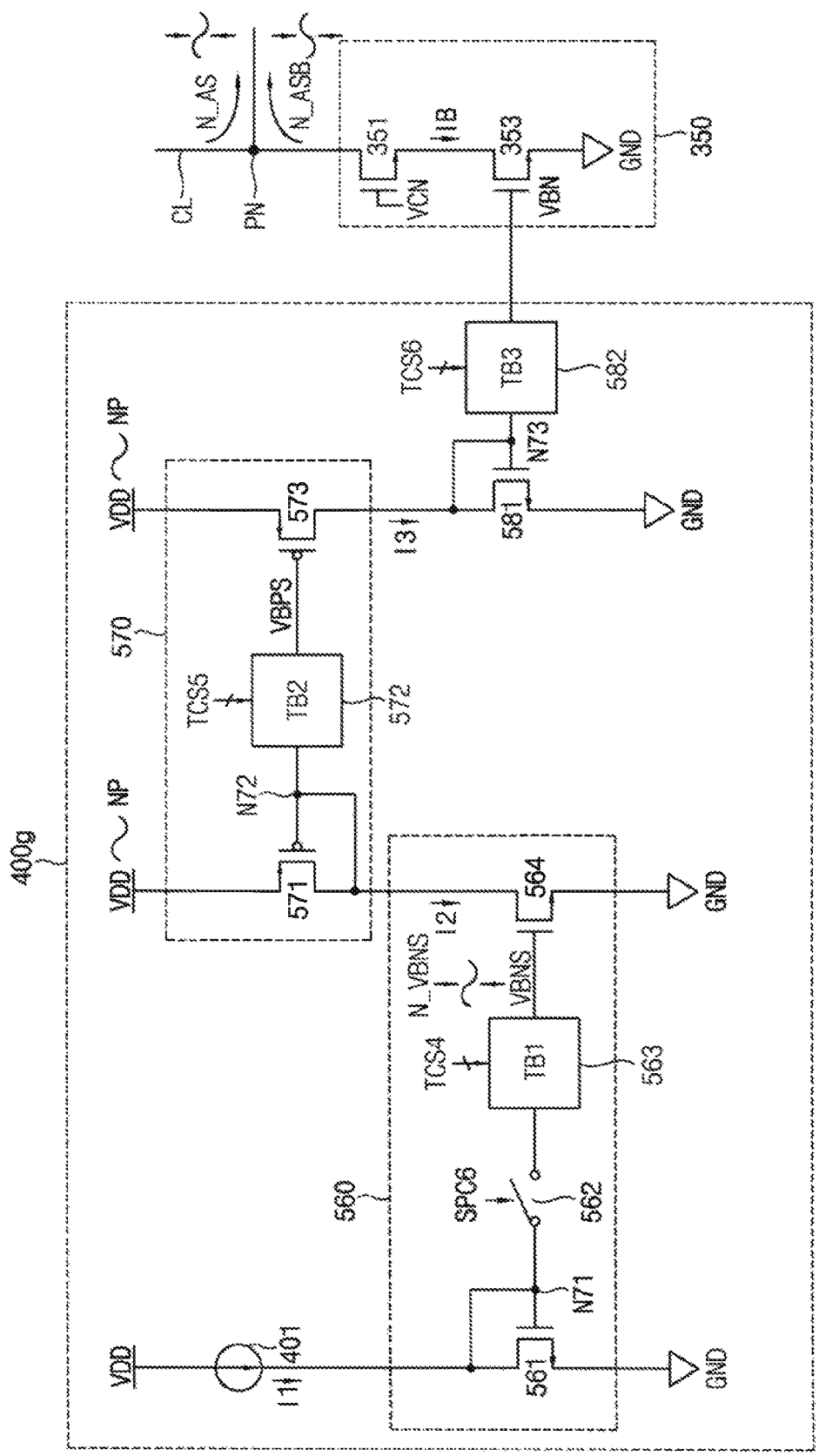
FIG. 21 illustrates a circuit diagram of another example of the bias voltage generator in FIG. 2 according to an embodiment of the inventive concept.

FIG. 21 illustrates a circuit diagram of another example of the bias voltage generator in FIG. 2 according to an embodiment of the inventive concept.

In FIG. 21, the pixel bias circuit 350 of FIG. 18 is also illustrated with a bias voltage generator 400g for convenience of explanation.

Referring to FIG. 21, the bias voltage generator 400g includes a current source 401, a switched current mirror 560, a current mirror 270, an NMOS transistor 581, and a third tuning bank 582.

The current source 401 is connected between the power supply voltage VDD and a first node N71, and provides a first current I1 having a constant magnitude to the first node N71.

The switched current mirror 560 is connected to the first node N71, the ground voltage GND and the second node N72, and draws a second current I2 having a same magnitude as the first current I1 from the second node N72 by mirroring the first current I1 when a sampling switch 562 therein is connected. The switched current mirror 560 includes an NMOS transistor 561, the sampling switch 562, a first tuning bank 563 and an NMOS transistor 564.

The NMOS transistor 561 has a drain and a gate coupled to the first node N71 and a source connected to the ground voltage GND. The sampling switch 562 is coupled to the first node N71 and the first tuning bank 563, and provides a voltage of the first node N71 to the first tuning bank 563 in response to the sampling control signal SPC6. The first tuning bank 563 is connected to the sampling switch 562 and a gate of the NMOS transistor 564, stores a portion of the voltage at the first node N71 therein in response to a tuning control signal TCS4 and provides the gate of the NMOS transistor 564 with the stored voltage as a first secondary bias voltage VBNS.

The first tuning bank 563 may have a same configuration as the first tuning bank 540 in FIG. 20. Therefore, the portion of the voltage of the first node N71 is stored in the first tuning bank 563 according to the bits of the tuning control signal TCS4, a magnitude of an AC component N_VBNS of the first secondary bias voltage VBNS is adjusted according to the tuning control signal TCS4, and a magnitude of the third noise component N_ASB is adjusted.

The NMOS transistor 564 includes a drain coupled to the second node N72, a gate coupled to the first tuning bank 563 and a drain coupled to the ground voltage GND. The NMOS transistor draws the second current I2 from the second node N72.

The current mirror 570 is connected to the power supply voltage VDD, the second node N72 and a third node N73. The current mirror 570 includes a PMOS transistor 571, a second tuning bank 572 and a PMOS transistor 573. The current mirror 570 provides a third current I3 having a same magnitude as the second current I2 to the third node N73 by mirroring the second current I2.

The PMOS transistor 571 includes a source coupled to the power supply voltage VDD, and a gate and a drain coupled to the second node N72. Therefore, a voltage of the second node N72 caused by the second current I2 is provided to the second tuning bank 572. The second tuning bank 572 is connected to the second node N72 and a gate of the PMOS transistor 573, stores a portion of the voltage of the second node N72 therein in response to a tuning control signal TCS5 and provides the gate of the PMOS transistor 573 with the stored voltage as a second secondary bias voltage VBPS. The second tuning bank 572 may have a same configuration as the second tuning bank 550 in FIG. 20. Therefore, the portion of the voltage of the second node N72 is stored in the second tuning bank 572 according to the bits of the tuning control signal TCS5, a magnitude of an AC component of the second secondary bias voltage VBPS is adjusted according to the tuning control signal TCS5, and a phase of the third noise component N_ASB is adjusted.

The PMOS transistor 573 includes a source coupled to the power supply voltage VDD, a gate coupled to the second tuning bank 572 and a drain coupled to the third node N73. The PMOS transistor 573 provides the third current I3 at the drain to the third node N73.

The drain and gate of the NMOS transistor 581 are coupled to the third node N73 and the source of the NMOS transistor 581 is coupled to the ground voltage GND. Therefore, a voltage of the third node N73 caused by the third current I3 is provided to the third tuning bank 582.

The third tuning bank 582 is connected to the third node N73, the ground voltage GND and the pixel bias circuit 350, stores a portion of a voltage of the third node N73 therein in response to a tuning control signal TCS6 and provides the pixel bias circuit 350 with the stored voltage as the bias voltage VBN. The third tuning bank 582 may have a same configuration as the second tuning bank 550 in FIG. 20. Therefore, the portion of the third node N73 is stored in the third tuning bank 582 according to the bits of the tuning control signal TCS6, a magnitude of an AC component of the bias voltage VBN is adjusted according to the tuning control signal TCS6, and a phase of the third noise component N_ASB is adjusted. Therefore, the pixel bias circuit 350 may adjust the phase of the third nose component N_ASB substantially opposite to the phase of the second nose component N_AS.

That is, in the bias voltage generator 400g of FIG. 21, the first tuning bank 563 adjusts the magnitude of the third nose component N_ASB and the second and third tuning banks 572 and 582 adjust the phase of the third nose component N_ASB such that the second noise component N_AS is cancelled by the third nose component N_ASB.

In FIG. 21, the sampling control signal SPC6 and the tuning control signals TCS4, TCS5 and TCS6 may be included in the third control signal CTL3 provided from the control circuit 200.

Figure 22:
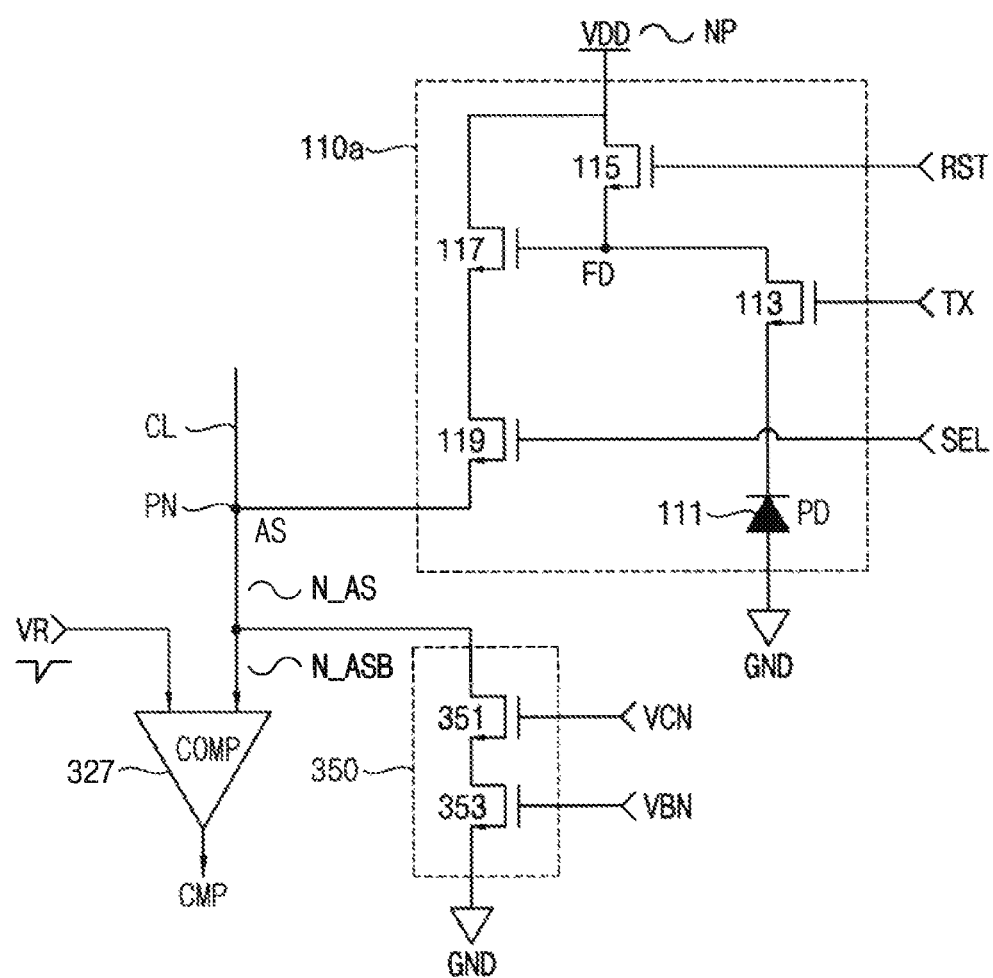
FIG. 22 illustrates a diagram for explaining operation of the comparator in FIG. 17 according to the present inventive concept.

FIG. 22 illustrates a diagram for explaining operation of the comparator in FIG. 17 according to the present inventive concept.

In FIG. 22, the unit pixel 110a of FIG. 3, the comparator 327 in FIG. 17 and the pixel bias circuit 330 of FIG. 18 are illustrated.

Referring to FIG. 22, the power supply voltage VDD to which unit pixel 110a is coupled includes the first noise component NP, and the analog signal AS output from the unit pixel 110a includes the second noise component N_AS. As described with reference to FIGS. 19 through 21, the bias voltage generator 400e, 400f or 400g adjusts the AC component N_VBN of the bias voltage VBN to adjust the magnitude and/or the phase of the third noise component N_ASB which is output from the pixel bias circuit 350 to the pixel node PN such that the second noise component N_AS output from the unit pixel 110a is cancelled by the third noise component N_ASB. The comparator 327 of the CDS circuit 320a compares the ramp signal VR and the analog signal AS to output the comparison signal CMP, and the second noise component N_AS added to the analog signal AS and the second noise component N_ASB from the pixel bias circuit 350 cancel each other. Therefore, the comparison signal CMP includes none of the noise components.

Figure 23:
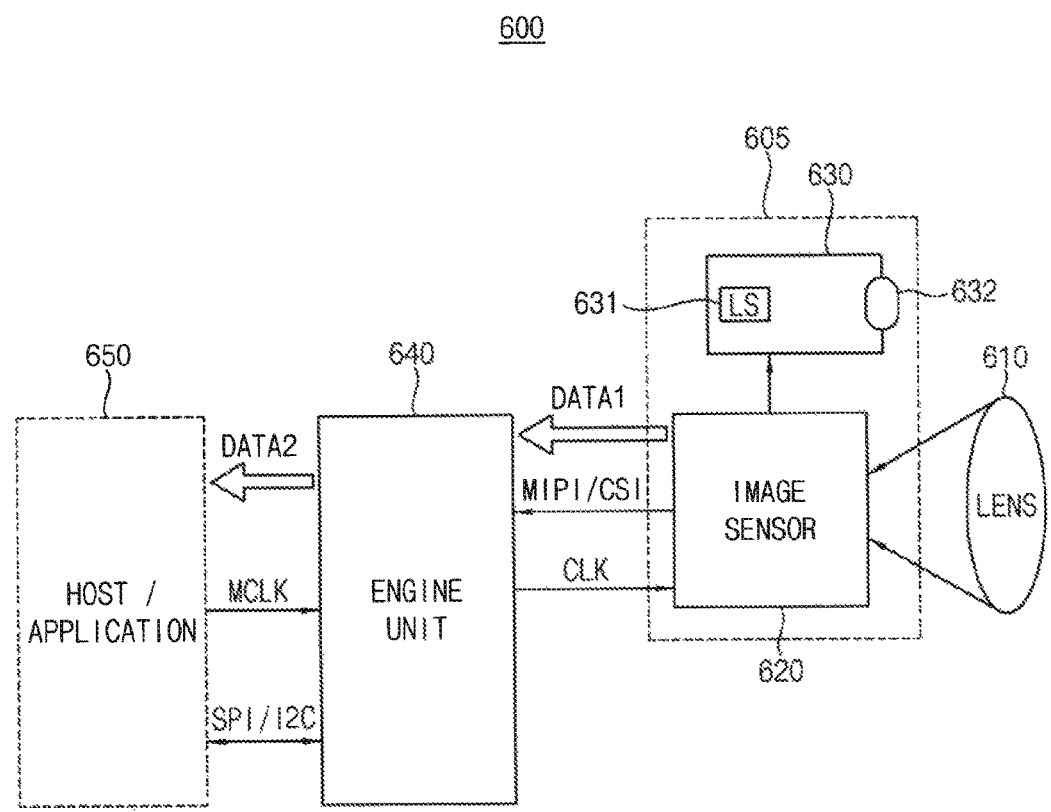
FIG. 23 illustrates a block diagram of an example of a camera including the image sensor according to an embodiment of the inventive concept.

FIG. 23 illustrates a block diagram of an example of a camera including the image sensor according to an embodiment of the inventive concept.

Referring to FIG. 23, a camera 600 includes a receiving lens 610, an image sensor chip 605 and a control engine 640. The image sensor chip 605 includes an image sensor 620 and a light source module 630. The light source module 630 includes a light source 631 and a lens 632.

The image sensor 620 may employ the image sensor 10 of FIG. 2. The receiving lens 610 may focus incident light on a photo-receiving region (e.g., the pixel array 100 in FIG. 2) of the image sensor 620. The image sensor 620 may generate data DATA1 including depth information and/or color image information based on the incident light passing through the receiving lens 610. The image sensor 620 may provide the data DATA1 to the control engine 640 in response to a clock signal CLK. In some embodiments, the image sensor 620 may interface with the control engine 640 using a mobile industry processor interface (MIPI) and/or a camera serial interface (CSI).

The control engine 640 may control the image sensor chip 605. The control engine 640 may process the data DATA1 received from the image sensor 620. For example, the control engine 640 may generate color data based on the received data DATA1. The control engine 640 may be coupled to a host/application 650, and may provide data DATA2 to the host/application 650 based on a master clock signal MCLK. In some embodiments, the control engine 640 may interface with the host/application 650 using a serial peripheral interface (SPI) and/or an inter integrated circuit (I2C) interface.

Embodiments of the inventive concept can be applied to various image sensor and various imaging systems. For instance, embodiments of the inventive concept can be applied to a mobile phone, a smart phone, a personal digital assistant (PDA), a portable multimedia player (PMP), a digital camera, a personal computer, a server computer, a workstation, a notebook, a digital television, a set-top box, a music player, a portable game console and a navigation system, or the like.

The foregoing is illustrative of example embodiments and is not to be construed as limiting thereof. Although a few example embodiments have been described, those skilled in the art will readily appreciate that many modifications are possible without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A read-out circuit of an image sensor, the read-out circuit comprising:
   a ramp signal generator configured to generate a ramp signal that linearly varies with a constant slope;
   a bias voltage generator configured to generate a bias voltage based on a power supply voltage, the power supply voltage having a first noise component; and
   a conversion circuit configured to perform an analog-to-digital conversion on an analog signal from a pixel to generate a digital signal corresponding to the analog signal based on the ramp signal, the analog signal having a second noise component,
   wherein the bias voltage generator is configured to adjust an alternating current (AC) component included in the bias voltage so that a magnitude of a third noise component in a reference voltage generated based on the bias voltage and the ramp signal or the third noise component provided from a pixel bias circuit coupled to a column line coupled to the pixel is substantially the same as a magnitude of the second noise component.

2. The read-out circuit of claim 1, wherein the conversion circuit comprises:
   a ramp buffer configured to generate the reference voltage based on the bias voltage and the ramp signal;
   a correlated double sampling (CDS) circuit configured to perform a CDS on the analog signal based on the reference voltage to generate a comparison signal; and
   a counter configured to generate the digital signal corresponding to the analog signal based on the comparison signal and a count clock signal.

3. The read-out circuit of claim 2, wherein the ramp buffer comprises a first p-channel metal oxide semiconductor (PMOS) transistor, a second PMOS transistor and a third PMOS transistor connected in series between the power supply voltage and a ground voltage,
the first PMOS transistor includes a source connected to the power supply voltage, a gate connected to the bias voltage, and a drain connected to the second PMOS transistor,
the second PMOS transistor includes a source connected to the first PMOS transistor, a gate connected to a cascode voltage, and a drain connected to the third PMOS transistor at an output node,
the third PMOS transistor includes a source connected to the third PMOS transistor at the output node, a gate receiving the ramp signal and a drain connected to the ground voltage, and
the reference voltage is provided at the output node.

4. The read-out circuit of claim 2, wherein the bias voltage generator comprises:
a first current source, connected between the power supply voltage and a first node, the first current source configured to generate a first current;
a current mirror circuit, connected to the first node, a ground voltage and a second node, the current mirror circuit configured to output a second current to the second node, wherein the second current corresponds to a sum of a first sub-current and a second sub-current, and the first sub-current is proportional to the first current; and
a p-channel metal oxide semiconductor (PMOS) transistor, connected between the power supply voltage and the second node, the PMOS transistor configured to provide the conversion circuit with the bias voltage based on the second current,
wherein the current mirror circuit is configured to adjust a magnitude of the AC component by adjusting a ratio of a first magnitude of the first sub-current and a second magnitude of the second sub-current.

5. The read-out circuit of claim 4, wherein the current mirror circuit comprises:
a first n-channel metal oxide semiconductor (NMOS) transistor that has a drain and a gate coupled to the first node, and a source coupled to the ground voltage;
a first current generation circuit connected between the first node, the second node and the ground voltage, wherein the first current generation circuit is configured to generate the first sub-current having the first magnitude which varies in response to a first switching control signal; and
a second current generation circuit connected in parallel with the first current generation circuit between the second node and the ground voltage, wherein the second current generation circuit is configured to generate the second sub-current having the second magnitude which varies in response to a second switching control signal.

6. The read-out circuit of claim 5, wherein the first current generation circuit comprises:
a plurality of first switches each connected to the second node; and
a plurality of second NMOS transistors respectively connected in series between corresponding ones of the first switches and the ground voltage,
wherein the second current generation circuit comprises
a plurality of second switches each connected to the second node; and
a plurality of second current sources respectively connected in series between corresponding ones of the second switches and the ground voltage, and
wherein each gate of the second NMOS transistors is coupled to the gate of the first NMOS transistor at the first node, and
the first magnitude of the first sub-current and the second magnitude of the second sub-current are adjustable.

7. The read-out circuit of claim 2, wherein the bias voltage generator comprises:
a current source, connected between the power supply voltage and a first node, the current source configured to generate a first current;
a current mirror circuit, connected to the first node, a ground voltage and a second node, the current mirror circuit configured to output a second current to the second node;
a p-channel metal oxide semiconductor (PMOS) transistor, connected between the power supply voltage and the second node, the PMOS transistor configured to provide the bias voltage based on the second current;
a sampling switch connected between the second node and a third node, wherein the sampling switch is switched in response to a sampling control signal;
a first sampling bank connected between the power supply voltage and the third node, wherein the first sampling bank is configured to sample a first portion of the bias voltage in response to a first switching control signal; and
a second sampling bank connected between the third node and the ground voltage, wherein the second sampling bank is configured to sample a second portion of the bias voltage in response to a second switching control signal.

8. The read-out circuit of claim 7, wherein the first sampling bank comprises:
a plurality of first capacitors each connected to the power supply voltage; and
a plurality of first switches respectively connected in series between corresponding ones of the first capacitors and the third node,
wherein the second sampling bank comprises
a plurality of second switches each connected to the third node; and
a plurality of second capacitors respectively connected in series between corresponding ones of the second switches and the ground voltage,
wherein the plurality of first switches are switched in response to the first switching control signal, and the plurality of second switches are switched in response to the second switching control signal, and
wherein a magnitude of the AC component is adjusted by the first portion and the second portion of the bias voltage.

9. The read-out circuit of claim 2, wherein the bias voltage generator comprises:
a current source, connected between the power supply voltage and a first node, the current source configured to generate a first current;
a switched current mirror circuit, connected to the first node, the power supply voltage, a ground voltage and a third node, the switched current mirror circuit configured to output a second current proportional to the first current to the third node when a sampling switch therein is turned on; and
a p-channel metal oxide semiconductor (PMOS) transistor having a source connected to the power supply voltage, and a gate and a drain connected to the third node, wherein the PMOS transistor is configured to provide the conversion circuit with the bias voltage based on the second current.

10. The read-out circuit of claim 9, wherein the switched current mirror circuit further comprises:
a first n-channel metal oxide semiconductor (NMOS) transistor that has a drain and a gate coupled to the first node, and a source coupled to the ground voltage;
a first sampling bank connected between a second node and the power supply voltage, wherein the first sampling bank is configured to sample a first portion of a secondary bias voltage at the second node in response to a first switching control signal, the second node is connected to the sampling switch and the sampling switch is connected to a gate of the first NMOS transistor;
a second sampling bank connected between the second node and the ground voltage, wherein the second sampling bank is configured to sample a second portion of the secondary bias voltage in response to a second switching control signal; and
a second NMOS transistor that includes a gate coupled to the second node, a drain coupled to the third node, and a source coupled to the ground voltage,
wherein a magnitude of the AC component is adjusted by the first portion and the second portion of the secondary bias voltage.

11. The read-out circuit of claim 2, wherein the bias voltage generator comprises:
a current source, connected between a first node and a ground voltage, the current source configured to draw a first current from the first node;
a switched current mirror circuit, connected to the first node, the power supply voltage, the ground voltage and a third node, the switched current mirror configured to output a second current proportional to the first current to the third node when a sampling switch therein is turned on;
a current mirror circuit connected to the third node, the ground voltage and a fourth node, the current mirror configured to mirror the second current to output a third current proportional to the second current to the fourth node; and
a first p-channel metal oxide semiconductor (PMOS) transistor having a source connected to the power supply voltage, and a gate and a drain connected to the fourth node, wherein the first PMOS transistor is configured to provide the conversion circuit with the bias voltage based on the third current.

12. The read-out circuit of claim 11, wherein the switched current mirror further comprises:
a second PMOS transistor that has a source coupled to the power supply voltage, and a gate and a drain coupled to the first node;
a first sampling bank connected between a second node and the power supply voltage, wherein the first sampling bank is configured to sample a first portion of a voltage at the second node in response to a first switching control signal, the second node is connected to the sampling switch and the sampling switch is connected to a gate of the second PMOS transistor;
a second sampling bank connected between the second node and the ground voltage, wherein the second sampling bank is configured to sample a second portion of the voltage at the second node in response to a second switching control signal; and
a third PMOS transistor that includes a gate coupled to the second node, a source coupled to the power supply voltage and a drain coupled to the third node, and
wherein a magnitude of the AC component is adjusted by the first portion and the second portion of the voltage at the second node.

13. The read-out circuit of claim 1, wherein the conversion circuit comprises:
the pixel bias circuit configured to generate a bias current for driving the pixel, configured to generate the third noise component and configured to provide the third noise component to a pixel node coupled to the column line;
a correlated double sampling (CDS) circuit configured to perform a CDS on the analog signal based on the ramp signal to generate a comparison signal; and
a counter configured to generate the digital signal corresponding to the analog signal based on the comparison signal and a count clock signal,
wherein the pixel bias circuit comprises first and second NMOS transistor connected in series between the pixel node and a ground voltage,
the first NMOS transistor includes a drain coupled to the pixel node, a gate coupled to a cascode voltage and a source coupled to the second NMOS transistor, and
the second NMOS transistor includes a drain coupled to the first NMOS transistor, a gate coupled to the bias voltage and a source coupled to the ground voltage.

14. The read-out circuit of claim 13, wherein the bias voltage generator comprises:
a current source, connected between a first node and the ground voltage, the current source configured to generate a first current;
a switched current mirror, connected between the power supply voltage, the current source and a second node, the switched current mirror configured to output a second current to the second node by mirroring the first current when a sampling switch therein is turned-on, and configured to adjust a magnitude of the third nosie component;
the third NMOS transistor connected between the second node and the ground voltage; and
a second tuning bank, connected between the second node and the pixel bias circuit, the second tuning bank configured to adjust a phase of the third noise component.

15. The read-out circuit of claim 14, wherein the switched current mirror comprises:
a first PMOS transistor that includes a source coupled to the power supply voltage, and a gate and a drain coupled to the first node;
a first tuning bank coupled to the sampling switch; and
a second PMOS transistor that includes a source coupled to the power supply voltage, a gate coupled to the first tuning bank and a drain coupled to the second node,
wherein the first tuning bank comprises:
a plurality of first capacitors connected in parallel to a third node coupled to the sampling switch;
a plurality of first PMOS transistors connected between first connection nodes and the power supply voltage, wherein each of the first connection nodes is coupled to each of the first capacitors; and
a plurality of first NMOS transistors connected between the first connection nodes and the ground voltage,
wherein the first tuning bank receives a first tuning control signal, wherein the first tuning bank stores a portion of a voltage of the first node in response to each parallel connected pair of the first PMOS transistors and the first NMOS transistors receiving a corresponding bit of bits of the first turning control signal, and the first tuning bank adjusts the magnitude of the third noise component in response to the stored voltage therein.

16. The read-out circuit of claim 15, wherein the second tuning bank comprises:
a plurality of second capacitors connected in parallel to the second node;
a plurality of second PMOS transistors connected between second connection nodes and the power supply voltage, wherein each of the second connection nodes is coupled to each of the second capacitors; and
a plurality of second NMOS transistors connected between the second connection nodes and the ground voltage,
wherein the second tuning bank receives a second tuning control signal, and
wherein the second tuning bank stores a portion of a voltage of the second node in response to each parallel connected pair of the second PMOS transistors and the second NMOS transistors receiving a corresponding bit of bits of the second turning control signal, and the second tuning bank adjusts the phase of the third noise component in response to the stored voltage therein.

17. An image sensor comprising:
a pixel array connected to a power supply voltage, the pixel array including a plurality of unit pixels configured to sense an incident light and to generate analog signals;
a ramp signal generator configured to generate a ramp signal that changes with a constant slope;
a bias voltage generator configured to generate a bias voltage based on the power supply voltage, the power supply voltage having a first noise component; and
a plurality of conversion circuits each configured to perform an analog-to-digital conversion on respective different ones of the analog signals to generate digital signals corresponding to the analog signals based on the ramp signal, the analog signals having a second noise component,
wherein the bias voltage generator is configured to adjust an alternating current (AC) component included in the bias voltage so that a magnitude of a third noise component in the reference voltages generated based on the bias voltage and the ramp signal or the third noise component provided from a pixel bias circuit coupled to a column line coupled to the pixel is substantially the same as a magnitude of the second noise component.

18. An image sensor comprising:
a pixel connected to a power supply voltage and configured to generate an analog signal responsive to incident light, the power supply voltage having a first noise component and the analog signal having a second noise component; and
a read-out circuit configured to generate a bias voltage based on the power supply voltage, to generate a reference voltage based on the bias voltage and a ramp signal, to convert the analog signal to a digital signal, and to adjust an alternating current (AC) component in the bias voltage so that a magnitude of a third noise component in the reference voltage is substantially the same as a magnitude of the second noise component.

19. The image sensor of claim 18, wherein the read-out circuit comprises:
a ramp signal generator configured to generate the ramp signal that linearly varies with a constant slope;
a ramp buffer configured to generate the reference voltage based on the bias voltage and the ramp signal;
a correlated double sampling (CDS) circuit configured to perform a CDS on the analog signal based on the reference voltage to generate a comparison signal; and
a counter configured to generate the digital signal corresponding to the analog signal based on the comparison signal and a count clock signal.

20. The image sensor of claim 19, wherein the counter is configured to generate a first counting value based on a reset component of the analog signal, to generate a second counting value based on an image component of the analog signal, and to subtract the first counting value from the second counting value to provide the digital signal.

* * * * *